US011662373B2

(12) United States Patent
Ito et al.

(10) Patent No.: US 11,662,373 B2
(45) Date of Patent: May 30, 2023

(54) SUBSTRATE STORAGE CONTAINER MANAGEMENT SYSTEM, LOAD PORT, AND SUBSTRATE STORAGE CONTAINER MANAGEMENT METHOD

(71) Applicant: Sinfonia Technology Co., Ltd., Tokyo (JP)

(72) Inventors: Izumi Ito, Tokyo (JP); Tomoya Mizutani, Tokyo (JP)

(73) Assignee: Sinfonia Technology Co., Ltd., Tokyo (JP)

( * ) Notice: Subject to any disclaimer, the term of this patent is extended or adjusted under 35 U.S.C. 154(b) by 0 days.

(21) Appl. No.: 17/214,410

(22) Filed: Mar. 26, 2021

(65) Prior Publication Data

US 2021/0215752 A1    Jul. 15, 2021

Related U.S. Application Data

(63) Continuation-in-part of application No. 16/421,733, filed on May 24, 2019, now Pat. No. 10,978,325.

(30) Foreign Application Priority Data

May 24, 2018  (JP) ............................. JP2018-099494
Feb. 25, 2019  (JP) ............................. JP2019-031789

(51) Int. Cl.
*G01R 31/26* (2020.01)
*G01R 31/00* (2006.01)

(52) U.S. Cl.
CPC ....... *G01R 31/2637* (2013.01); *G01R 31/005* (2013.01)

(58) Field of Classification Search
CPC ........................... G01R 31/2637; G01R 31/005
(Continued)

(56) References Cited

U.S. PATENT DOCUMENTS

| 6,591,162 B1 | 7/2003 | Martin |
| 2010/0004785 A1* | 1/2010 | Mochizuki ....... G05B 19/41865 700/266 |

(Continued)

FOREIGN PATENT DOCUMENTS

| JP | 2004-517463 A | 6/2004 |
| JP | 2017-212322 A | 11/2017 |

OTHER PUBLICATIONS

Japan Patent Application No. 2018-208981, Office Action, dated Sep. 13, 2022.

*Primary Examiner* — Michael G Lee
*Assistant Examiner* — David Tardif
(74) *Attorney, Agent, or Firm* — Kilpatrick Townsend & Stockton LLP

(57) ABSTRACT

A method of diagnosing a load port includes identifying a plurality of entities for a plurality of substrate storage containers by a plurality of load ports capable of transferring a substrate into and out of the plurality of substrate storage containers; detecting directly or indirectly a plurality of states of the plurality of substrate storage containers by a plurality of sensors provided at the plurality of load ports; associating the plurality of load ports, the plurality of entities and a plurality of sensor values, with each other; accumulating, in a database, data associated in the act of associating the plurality of load ports, the plurality of entities, and the plurality of sensor values; and analyzing the data in the database and determining a state of each of the plurality of load ports.

6 Claims, 24 Drawing Sheets

(58) Field of Classification Search
USPC .......................................................... 235/451
See application file for complete search history.

(56) References Cited

U.S. PATENT DOCUMENTS

| | | | |
|---|---|---|---|
| 2014/0281168 A1* | 9/2014 | Koseki | G06F 3/0653 |
| | | | 711/103 |
| 2015/0369640 A1* | 12/2015 | Schulze | H01L 21/67253 |
| | | | 702/183 |
| 2017/0059416 A1* | 3/2017 | Fujisaki | G01K 3/04 |
| 2018/0017612 A1* | 1/2018 | Burton-Ccoca | G01R 31/2619 |
| 2018/0358249 A1* | 12/2018 | Nagaike | H01L 21/67393 |
| 2019/0362995 A1* | 11/2019 | Ito | G06K 7/10366 |
| 2020/0105555 A1* | 4/2020 | Lin | H01L 21/67288 |

* cited by examiner

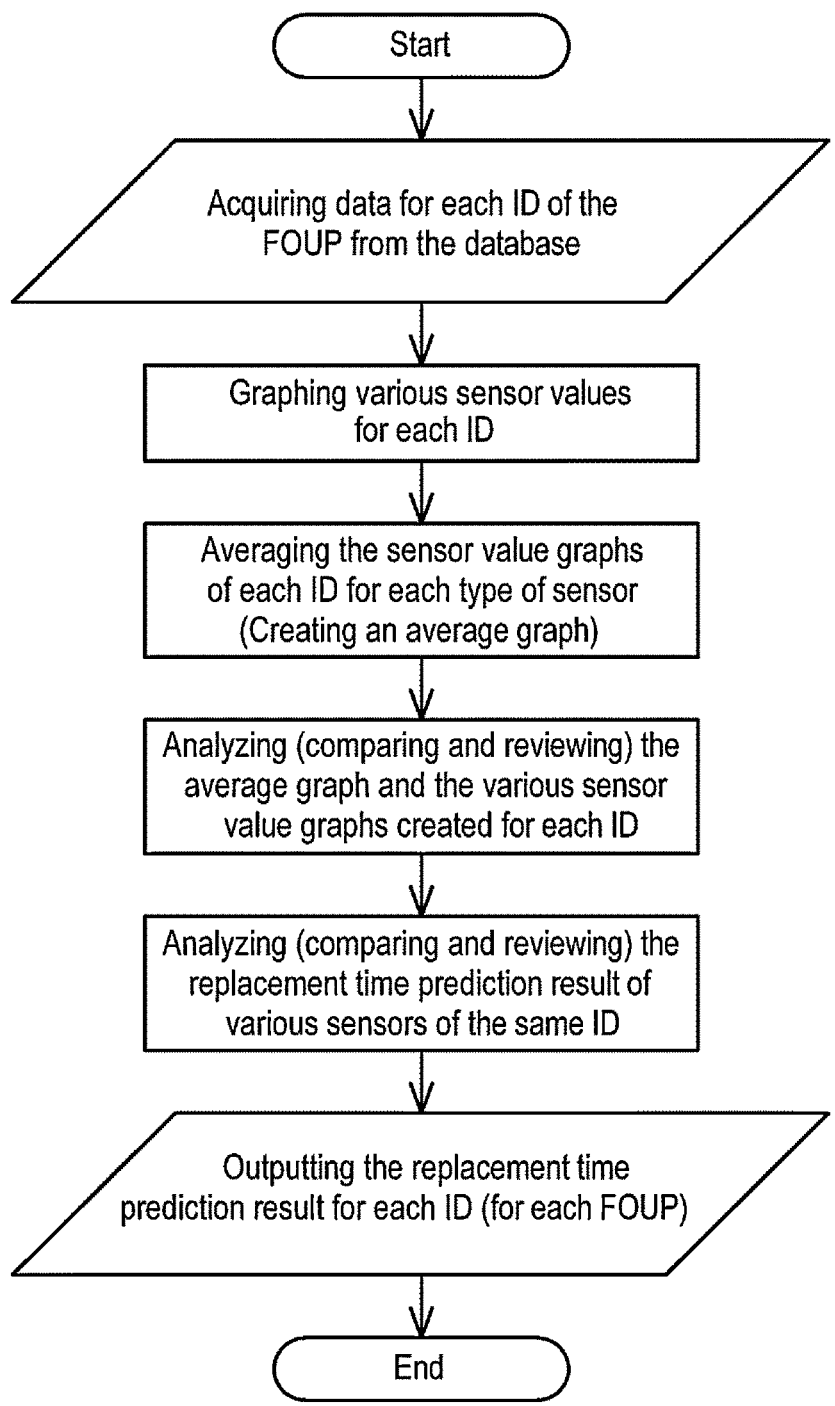

ID "A": "sensor value of first sensor"

ID "A": "sensor value of second sensor"

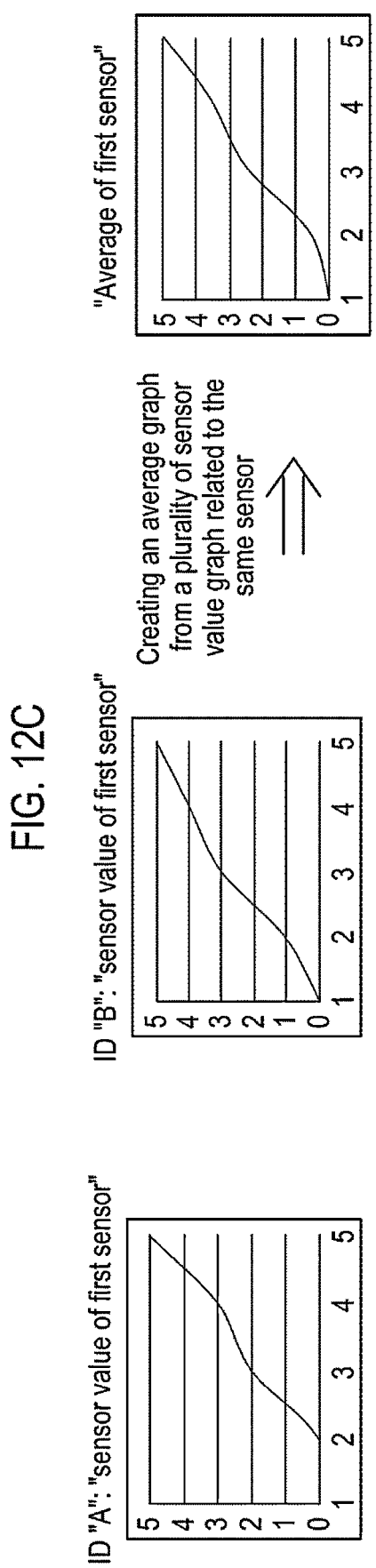

FIG. 12D
"Average of first sensor"   ID "A": "sensor value of first sensor"
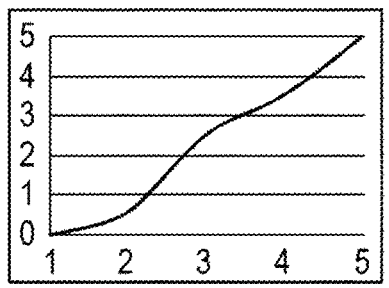 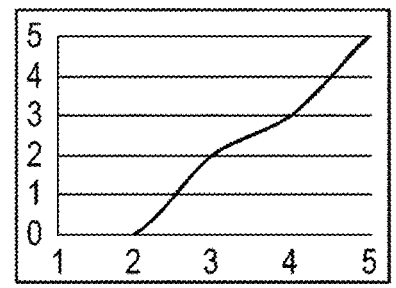
FIG. 13
| Entity identification (ID) | Exhaust nozzle pressure value | FOUP wafer position | Measurement date and time |
|---|---|---|---|
| 001 | | | |
| 002 | | | |
| 003 | | | |
| 001 | | | |
| 004 | | | |

FIG. 19

| First load port | |
|---|---|
| FOUP | Sensor value |
| 1 | 20 |
| 2 | 20 |
| 3 | 20 |

| Second load port | |
|---|---|
| FOUP | Sensor value |
| 3 | 10 |
| 1 | 10 |
| 2 | 10 |

| Third load port | |
|---|---|
| FOUP | Sensor value |
| 4 | 12 |
| 2 | 10 |
| 3 | 11 |

| Fourth load port | |
|---|---|
| FOUP | Sensor value |
| 1 | 9 |
| 5 | 8 |
| 3 | 10 |

FIG. 20

| First load port | |
|---|---|
| FOUP | Sensor value |
| 1 | 22 |
| 2 | 12 |
| 3 | 11 |

| Second load port | |
|---|---|
| FOUP | Sensor value |
| 3 | 9 |
| 1 | 20 |
| 2 | 10 |

| Third load port | |
|---|---|
| FOUP | Sensor value |
| 4 | 12 |
| 2 | 8 |
| 3 | 12 |

| Fourth load port | |
|---|---|
| FOUP | Sensor value |
| 1 | 18 |
| 5 | 11 |
| 3 | 11 |

SUBSTRATE STORAGE CONTAINER MANAGEMENT SYSTEM, LOAD PORT, AND SUBSTRATE STORAGE CONTAINER MANAGEMENT METHOD

CROSS-REFERENCE TO RELATED APPLICATIONS

This application is a continuation-in-part of U.S. patent application Ser. No. 16/421,733, filed on May 24, 2019, which application is based upon and claims the benefit of priority from Japanese Patent Application No. 2018-099494, filed on May 24, 2018, and Japanese Patent Application No. 2019-031789, filed on Feb. 25, 2019, the entire contents of which are incorporated herein by reference.

TECHNICAL FIELD

The present disclosure relates to a substrate storage container management system for managing deterioration information of a container (substrate storage container) capable of storing wafers, a load port applicable to the substrate storage container management system, and a substrate storage container management method.

BACKGROUND

In a semiconductor manufacturing process, wafers are processed in a clean room in order to improve the yield and the quality. In recent years, a "mini-environment method" for improving a degree of cleanliness only in a local space around a wafer is adopted, and a means for performing wafer transfer and other processes is employed. In the mini-environment method, a load port, which constitutes a part of a wall surface of a substantially-closed wafer transfer chamber (hereinafter referred to as "transfer chamber") in a housing, holds an FOUP (Front-Opening Unified Pod) as a container for storing wafers in a highly clean internal space, and has a function of opening and closing a door of the FOUP (hereinafter referred to as "FOUP door") while making close contact with the FOUP door, and the load port is provided adjacent the transfer chamber.

The load port is a device for loading and unloading wafers to and from the transfer chamber, and functions as an interface between the transfer chamber and the FOUP. Then, when a door of the load port (hereinafter referred to as "load port door") which can engage with the FOUP door to open and close the FOUP door is opened, the wafer stored in the FOUP can be taken out into the transfer chamber, or the wafer can be stored in the FOUP from the transfer chamber by a transfer robot (wafer transfer device) disposed in the transfer chamber.

In a semiconductor manufacturing process, in order to properly maintain an atmosphere around wafers, a storage pod called a FOUP as described above is used to store and manage the wafers inside the FOUP. Particularly, in recent years, high integration of elements and miniaturization of circuits have been promoted. The surroundings of a wafer are required to be kept at a high degree of cleanliness so that particles and moisture do not adhere to a wafer surface. Therefore, in order to prevent a change in the properties of the wafer surface such as oxidization of the wafer surface or the like, a process (purge process) is also performed in which the inside of the FOUP is filled with a nitrogen gas so as to keep the surroundings of the wafer in a nitrogen atmosphere which is an inert gas, or in which the inside of the FOUP is kept in a vacuum state.

Since dust and impurities used in a process stay inside the FOUP, the FOUP is periodically cleaned with hot water and reused. By repeating the hot water cleaning, the resin-made FOUP is gradually deformed. Since the airtightness is reduced due to such deformation of the FOUP, there is posed a problem of inflow or leakage of a gas to or from the FOUP. For example, when distortion occurs in a loading/unloading port of an FOUP body that can be opened and closed by the FOUP door, the airtightness provided by the FOUP door is reduced. As a result, after carrying out a purge process to replace the gas in the FOUP with a nitrogen gas, the nitrogen gas in the FOUP may leak out of the FOUP during the transfer by an OHT or the like, and the ambient air may easily flow into the FOUP. This poses a problem where the oxygen concentration in the FOUP increases.

In order to address such a problem, it may be considered to adopt a method of determining a degree of deterioration of an FOUP by measuring the shape of the FOUP for each FOUP (hereinafter referred to as "the former method") or a method of uniformly replacing FOUPs that have been used over a predetermined number of use times or over a predetermined use period (hereinafter referred to as "the latter method").

However, in the former method, it is necessary to measure the shape of the FOUP one by one. Therefore, the time to carry out such shape measurement should be secured at an appropriate timing during a semiconductor manufacturing process or before or after the semiconductor manufacturing process. This is time-consuming and inefficient. In the latter method, the FOUP which has not deteriorated to such an extent as to be replaced may be replaced, and the cost required for the new purchase of a FOUP may increase more than necessary. Furthermore, the FOUP which has a large degree of deformation before reaching a predetermined number of use times or a predetermined use period may be continuously used until reaching the predetermined number of use times or the predetermined use period, and the inflow or leakage to or from the FOUP may occur.

Since the FOUP deformation progresses little by little, it is difficult to accurately grasp the replacement time due to deterioration for each FOUP. A replacement method such as the latter method or the like that ignores individual differences in FOUP is inefficient and may generate unnecessary replacement costs. There is no high probability that the inflow or leakage of a gas to or from the FOUP can be prevented in advance.

Thus, there has been proposed a management system including a detection means provided in a substrate storage container to detect its use state, a compact wireless communication means provided in the substrate storage container to determine an inspection check time, an inspection check device for inspecting and checking the substrate storage container at the inspection check time, and a notification means for notifying the contents according to any one of the determination result of the inspection check time of the substrate storage container by the wireless communication means and the inspection check result of the substrate storage container by the inspection check device, wherein the wireless communication means compares at least a detected value of the detection means with an inspection check value of the substrate storage container using an arithmetic processing part, and determines the inspection check time of the substrate storage container based on the comparison result (see Patent Document 1).

Patent Document 1 describes as follows. According to such a management system, the use condition of the substrate storage container is detected by the detection means provided in the substrate storage container. The detected value and the threshold value regarding the substrate storage container are compared in the wireless communication means which is an output destination of the detected value. As a result, if the detected value is smaller than the threshold value or is not close to the threshold value, it is determined that the substrate storage container can be used as it is. If the detected value is close to the threshold value or is larger than the threshold value, it is determined that the performance or the quality of the substrate storage container is deteriorated and that the use limit of the substrate storage container is near. This makes it possible to select a replacement product for the substrate storage container.

PRIOR ART DOCUMENTS

Patent Documents

Patent Document 1: Japanese Patent Application Publication No. 2017-212322

However, in the case of the management system described in Patent Document 1, it is essential to provide the sensor and the communicator (hereinafter referred to as "instruments such as a sensor and the like") in the FOUP which is a substrate storage container. Therefore, in addition to the need for an operation of mounting the instruments such as a sensor and the like, it is also required to mount a sensor power supply for each FOUP. Accordingly, in order to realize the system described in Patent Document 1, it is necessary to replace all the FOUPs with new FOUPs because the general FOUPs currently used as substrate storage containers cannot be used. In a semiconductor manufacturing line, a large number of FOUPs are already widely used. It is burdensome for the user to adopt the management system of Patent Document 1 by replacing all the FOUPs. It is considered that it is difficult to introduce the management system into a manufacturing site.

Furthermore, the following problems may be posed. The task of individually maintaining the instruments such as a sensor and the like mounted on a large number of FOUPs requires a lot of labor. It is also required to pay attention to the failure of the instruments such as a sensor and the like caused by the heat or water when cleaning FOUPs with hot water. It is difficult to thoroughly perform advance preparation or maintenance for using instruments such as a sensor and the like in a normal state. If the advance preparation or maintenance of the instruments such as a sensor and the like is insufficient, an accurate detection process cannot be performed by a sensor, an unstable wireless communication state may occur, and the FOUPs to be replaced cannot be appropriately selected. The use of a FOUP, which would otherwise be a target of replacement, may cause inflow or leakage of a gas to or from the FOUP. The surfaces of the wafers in the FOUP may be oxidized. Such problems may similarly occur in substrate storage containers other than an FOUP.

SUMMARY

The present disclosure has been made in view of such problems. It is an main object of the present disclosure to realize, by using a currently generally used FOUP instead of an FOUP provided with instruments such as a sensor and the like, a substrate storage container management system capable of predicting a replacement timing of a substrate storage container, which undergoes deterioration attributable to the use thereof and the like, in order to suppress oxidation of the surfaces of wafers stored in a substrate storage container such as an FOUP or the like. In addition, the present disclosure describes a technique capable of finding its application even in substrate storage containers other than an FOUP.

A substrate storage container management system according to the present disclosure includes: a load port that is configured to transfer a substrate into and out of one or more substrate storage containers, and includes: an ID (identification) reader configured to read one or more entity IDs for the one or more substrate storage containers; and one or more sensors configured to directly or indirectly detect one or more states of the one or more substrate storage containers; an associator configured to associate the one or more entity IDs read by the ID reader with one or more sensor values detected by the one or more sensors; a database in which data associated by the associator is accumulated; and a data processor configured to analyze the data in the database and to output a state of a respective substrate storage container for each of the one or more entity IDs.

In this regard, the entity identification (ID) is used to specify each substrate storage container and may be used to determine from which substrate storage container the detected value of the sensor provided at the load port is obtained. In addition, the data regarding the time-dependent deterioration of the substrate storage container and the like is not written into the entity identification (ID). The "sensor configured to directly or indirectly detect a state of the substrate storage container" may be any sensor capable of detecting information which indicates deterioration (deformation) of the substrate storage container. Examples of the sensor may include a sensor for detecting the pressure of a gas (exhaust gas) exhausted from the inside of the substrate storage container to the outside of the substrate storage container through a port of the substrate storage container at the time of a purge process for replacing the inside of through substrate storage container with a suitable gas such as a nitrogen gas or the like and a mapping sensor for detecting a substrate position in the substrate storage container. The deformation of the substrate storage container can be grasped from the pressure sensor value of the exhaust gas or the detected value of the mapping sensor. That is to say, when the pressure sensor value of the exhaust gas is lower than before, it may be considered that the substrate storage container is deformed and the gas in the substrate storage container is leaked to the outside through the deformed portion of the substrate storage container during the purge process. In addition, when the detected value of the mapping sensor is different from the previous detection value (when substrate displacement has occurred), it may be considered that the substrate storage container is deformed and the position of the substrate is changed. That is to say, the substrates stored in the substrate storage container are placed on a multistage shelf provided in the substrate storage container. The gap between the substrates in the height direction is changed as the deformation of the substrate storage container progresses. Therefore, by detecting such a change, it is possible to determine whether or not the substrate storage container is deformed. Furthermore, by detecting whether or not one substrate is inclined, it is possible to determine whether or not the substrate storage container is deformed.

With such a substrate storage container management system according to the present disclosure, it is not necessary to mount a sensor power source on each substrate storage container. The task of assigning entity identifications (IDs) to all the substrate storage containers is easier than the task of providing instruments such as a sensor and the like in all the substrate storage containers. Furthermore, the power supply to the ID reader and the sensor of the load port can be performed relatively easily using the electrical system of the load port. In addition, the substrate storage container management system according to the present embodiment is advantageous in that, by setting the installation target of the sensor to the load port, as compared with an embodiment in which the instruments such as a sensor and the like are provided for each substrate storage container as described as the prior art, it is possible to reduce the absolute number of instruments subjected to maintenance and to alleviate the burden of maintenance and it is not necessary to pay attention to the failure of instruments such as a sensor and the like caused by the heat or water intrusion at the time of cleaning the substrate storage container with hot water.

Furthermore, according to the substrate storage container management system of the present disclosure, the entity identification (ID) assigned to the substrate storage container already used in many manufacturing sites and the detected value obtained by the sensor provided in the load port are associated to create a database, the data in the database is analyzed by the data processor, and the state of the substrate storage container for each entity identification (ID) is outputted, whereby deterioration information of the substrate storage container can be acquired and grasped. By utilizing the substrate storage container management system according to the present disclosure, it is possible to specify the replacement time of each substrate storage container based on the deterioration information. By replacing the substrate storage container to be replaced with a new substrate storage container, it is possible to prevent or suppress a situation that the surfaces of the substrates accommodated in the substrate storage container are oxidized due to the deformation of the substrate storage container. This makes it possible to reduce the frequency of occurrence of errors. Thus, the down time of the semiconductor manufacturing apparatus is shortened, and the productivity is improved.

In the present disclosure, the data processor may include: a calculator configured to calculate statistical data from one or more sensor values detected by a specific sensor of the one or more sensors; a comparator configured to compare a sensor value associated with a specific entity ID of the one or more entity IDs for a specific substrate storage container with a calculation result obtained by the calculator; and a state output part configured to output a state of the specific substrate storage container based on a comparison result obtained by the comparator.

By providing the calculator and the comparator in the data processor, it is possible to make versatile the data processing in the data processor.

In the present disclosure, the one or more sensors of the load port may include plural types of sensors, and the associator may be configured to associate the one or more entity IDs with plural types of sensor values detected by the plural types of sensors.

According to such a configuration, the state of the substrate storage container can be determined using plural types of sensor values. It is therefore possible to enhance the accuracy of determination.

In the present disclosure, the system may further include an operation adjuster configured to adjust a control value associated with processing of the respective substrate storage container at the load port based on the state of the respective substrate storage container for each of the one or more entity IDs that is outputted by the data processor.

By providing such an operation adjuster, the processing on the substrate storage container performed at the load port can be adjusted according to the state of the substrate storage container. It is therefore possible to suppress generation of an error at the load port and to perform smooth processing.

In the present disclosure, the associator may be configured to associate the one or more entity IDs with at least one of error information that is generated during processing of the respective substrate storage container and process information on processing of the substrate stored in the respective substrate storage container, and the substrate storage container management system may further include an operation adjuster configured to adjust a control value associated with the processing of the respective substrate storage container at the load port based on the at least one of the error information and the process information for each of the one or more entity IDs that is accumulated in the database.

By providing such an operation adjuster, the processing on the substrate storage container performed at the load port can be adjusted according to the error generated in advance or the processing performed on the substrate. It is therefore possible to suppress generation of an error at the load port and to perform smooth processing.

In the present disclosure, the system may further include a host system configured to communicate with the load port, and at least the associator, the database, and the data processor may be provided in the host system.

By providing such a host system separately from the load port, it is possible for the host system to process the data acquired at a plurality of load ports.

In the present disclosure, the data processor may include a learning part configured to learn the one or more states of the one or more substrate storage containers from the one or more sensor values detected by the one or more sensors.

By providing such a learning part, it is possible to estimate the state of the substrate storage container with high accuracy.

A load port for transferring a substrate into and out of one or more substrate storage containers, according to the present disclosure, includes an ID reader configured to read one or more entity IDs for the one or more substrate storage containers; and one or more sensors configured to directly or indirectly detect one or more states of the one or more substrate storage containers, wherein the load port is employed in a substrate storage container management system including: an associator configured to associate the one or more entity IDs read by the ID reader with one or more sensor values detected by the one or more sensors; a database in which data associated by the associator is accumulated; and a data processor configured to analyze the data in the database and to output a state of a respective substrate storage container for each of the one or more entity IDs.

According to such a load port, as described above, it is possible to acquire the sensor value related to the management of the substrate storage container and to appropriately manage the substrate storage container.

A substrate storage container management method according to the present disclosure includes: reading, by a load port configured to transfer a substrate into and out of one or more substrate storage containers, one or more entity IDs for the one or more substrate storage containers; detecting, by one or more sensors provided at the load port, one or more states of the one or more substrate storage containers, directly or indirectly; associating the one or more entity IDs with one or more sensor values that are detected in the act of detecting the one or more states; accumulating data associated in the act of associating the one or more entity IDs in a database; and analyzing the data in the database and outputting a state of a respective substrate storage container for each of the one or more entity IDs.

With such a substrate storage container management method according to the present disclosure, the state of each substrate storage container can be outputted by using the substrate storage containers already used in many manufacturing sites as they are without significantly changing the specifications. Then, it is possible to predict the replacement time of each substrate storage container based on the output information on the state of the substrate storage container.

In the present disclosure, the method may further include adjusting a control value associated with processing of the respective substrate storage container at the load port based on the state of the respective substrate storage container for each of the one or more entity IDs that is outputted in the act of outputting the state.

By providing such an operation adjustment step, the processing on the substrate storage container performed at the load port can be adjusted according to the state of the substrate storage container. It is therefore possible to suppress generation of an error at the load port and to perform smooth processing.

In the present disclosure, in the act of associating the one or more entity IDs, the one or more entity IDs may be associated with at least one of error information that is generated during processing of the respective substrate storage container and process information on processing of the substrate stored in the respective substrate storage container, and the method may further include adjusting a control value associated with the processing of the respective substrate storage container at the load port based on the at least one of the error information and the process information for each of the one or more entity IDs that is accumulated in the database.

By providing such an operation adjustment step, the processing on the substrate storage container performed at the load port can be adjusted according to the error generated in advance or the processing performed on the substrate. It is therefore possible to suppress generation of an error at the load port and to perform smooth processing.

A method of diagnosing a load port according to another embodiment of the present disclosure includes: identifying a plurality of entities for a plurality of substrate storage containers by a plurality of load ports capable of transferring a substrate into and out of the plurality of substrate storage containers; detecting directly or indirectly a plurality of states of the plurality of substrate storage containers by a plurality of sensors provided at the plurality of load ports; associating the plurality of load ports, the plurality of entities identified in the act of identifying the plurality of entities, and a plurality of sensor values detected in the act of detecting the plurality of states, with each other; accumulating, in a database, data associated in the act of associating the plurality of load ports, the plurality of entities, and the plurality of sensor values; and analyzing the data in the database and determining a state of each of the plurality of load ports.

If an abnormality of a specific load port is determined in the act of determining the state of each of the plurality of load ports, the method further includes: searching for one or more substrate storage containers that have been mounted on the specific load port; determining a state of each of the one or more substrate storage containers found in the act of searching for the one or more substrate storage containers; and determining a cause of the abnormality of the specific load port based on a result of the act of determining the state of each of the plurality of load ports and a result of the act of determining the state of each of the one or more substrate storage containers.

In this embodiment, the act of determining the cause of the abnormality of the specific load port includes: upon determining that an abnormality has occurred in a specific substrate storage container in the act of determining the state of each of the one or more substrate storage containers, determining that the specific substrate storage container has caused the abnormality of the specific load port; and upon determining that an abnormality has occurred in none of the one or more substrate storage containers in the act of determining the state of each of the one or more substrate storage containers, determining that the specific load port has caused the abnormality of the specific load port.

A substrate storage container management system of the present disclosure includes: a plurality of load ports capable of transferring a substrate into and out of a plurality of substrate storage containers, each of the plurality of load ports comprising: an ID (identification) reader capable of reading a plurality of entity IDs attached to the plurality of substrate storage containers; one or more sensors configured to directly or indirectly detect a plurality of states of the plurality of substrate storage containers; and a host system. In this regard, the plurality of load ports are assigned a plurality of load port IDs, which identifies the plurality of load ports from each other, respectively. And, each of the plurality of load ports includes a load port communicator configured to transmit one or more sensor values detected by the one or more sensors to the host system, and the host system includes a host system communicator configured to receive the one or more sensor values transmitted from the plurality of load ports. In addition, the plurality of load ports or the host system includes: an associator configured to associate the load port IDs, the plurality of entity IDs read by the ID reader, and the one or more sensor values with each other; a database in which data associated by the associator is accumulated; and a data processor configured to analyze the data in the database and to determine states of the plurality of load ports for the plurality of load port IDs, respectively.

The substrate storage container management system of the present disclosure, the one or more sensors include plural types of sensors selected among a pressure sensor provided in an exhaust nozzle configured to purge gas in the one or more substrate storage containers, a mapping sensor configured to detect a wafer in the one or more substrate storage containers, a sensor configured to detect a time taken for a container door to move from a fully-closed position to an open position, a torque sensor configured to detect a rotational torque when a latch key provided at the container door is opened and closed. The load port communicator is configured to transmit sensor values detected by the plural types of sensors to the host system; and the associator is configured to associate the plurality of load port IDs, the plurality of entity IDs, and the sensor values detected by the plural types of sensors with each other.

A method of diagnosing a load port according to another embodiment of the present disclosure includes: identifying a plurality of entities for a plurality of substrate storage containers by a plurality of load ports capable of transferring a substrate into and out of the plurality of substrate storage containers; measuring a plurality of tact times for the plurality of substrate storage containers, which have been taken for the plurality of load ports, respectively; associating the plurality of load ports, the plurality of entities identified in the act of identifying the plurality of entities, and plurality of tact times measured in the act of measuring the plurality of tact times; accumulating, in a database, data associated in the act of associating the plurality of load ports, the plurality of entities, and the plurality of tact times, with each other; and analyzing the data in the database and determining a state of time loss of each of the plurality of load ports.

If a time loss of a specific load port is determined in the act of determining the state of time loss of each of the plurality of load ports, the method further includes: searching for one or more substrate storage containers that have been mounted on the specific load port; determining a state of time loss of each of the one or more substrate storage containers found in the act of searching for the one or more substrate storage containers; and determining a cause of the time loss of the specific load port based on a result of the act of determining the state of time loss of each of the plurality of load ports and a result of the act of determining the state of time loss of each of the one or more substrate storage containers.

In this embodiment, the act of determining the cause of the time loss of the specific load port includes: upon determining that a time loss has occurred in a specific substrate storage container in the act of determining the state of time loss of each of the one or more substrate storage containers, determining that the specific substrate storage container has caused of the time loss of the specific load port; and upon determining that a time loss has occurred in none of the one or more substrate storage containers in the act of determining the state of time loss of each of the one or more substrate storage containers, determining that the specific load port has caused the time loss of the specific load port.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIGS. 11A and 11B are a functional block diagram and a flowchart of a data processor according to the first embodiment.

FIG. 12A to FIG. 12D are views schematically showing processing contents in the data processor according to the first embodiment.

FIG. 13 is a view showing a database (table) of the data processor according to the first embodiment.

FIG. 19 depicts an example in which a specific load port is determined to have caused an abnormality of the specific load port.

FIG. 20 depicts an example in which a specific substrate storage container is determined to have caused an abnormality of a specific load port.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, a first embodiment of the present disclosure will be described with reference to the drawings.

Figure 1:
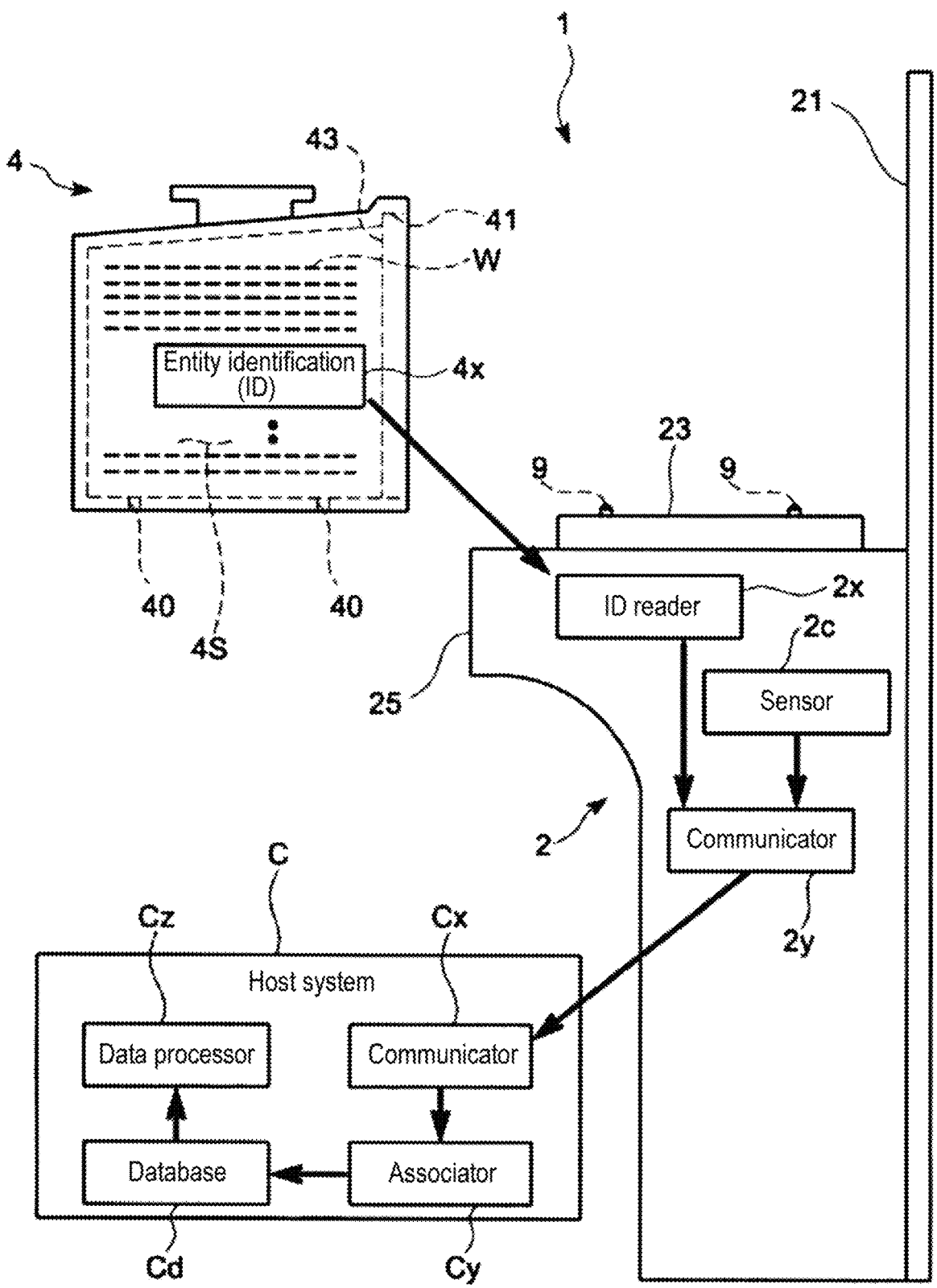
FIG. 1 is a block diagram of a substrate storage container management system according to a first embodiment of the present disclosure.

For example, as shown in FIG. 1, the substrate storage container management system 1 according to the present embodiment is configured by an FOUP 4 which is a substrate storage container used in a semiconductor manufacturing process, a load port 2 and a host system C. Specifically, the substrate storage container management system 1 is capable of transmitting an entity identification (ID) 4x assigned to the FOUP 4 and a sensor value on the FOUP 4 detected by a sensor 2c provided at the load port 2 from a communicator 2y of the load port 2 to the host system C, associating the entity identification (ID) 4x with the sensor value in the host system C to create a database, and outputting a state of the FOUP 4 based on the data of the database Cd.

Figure 2:
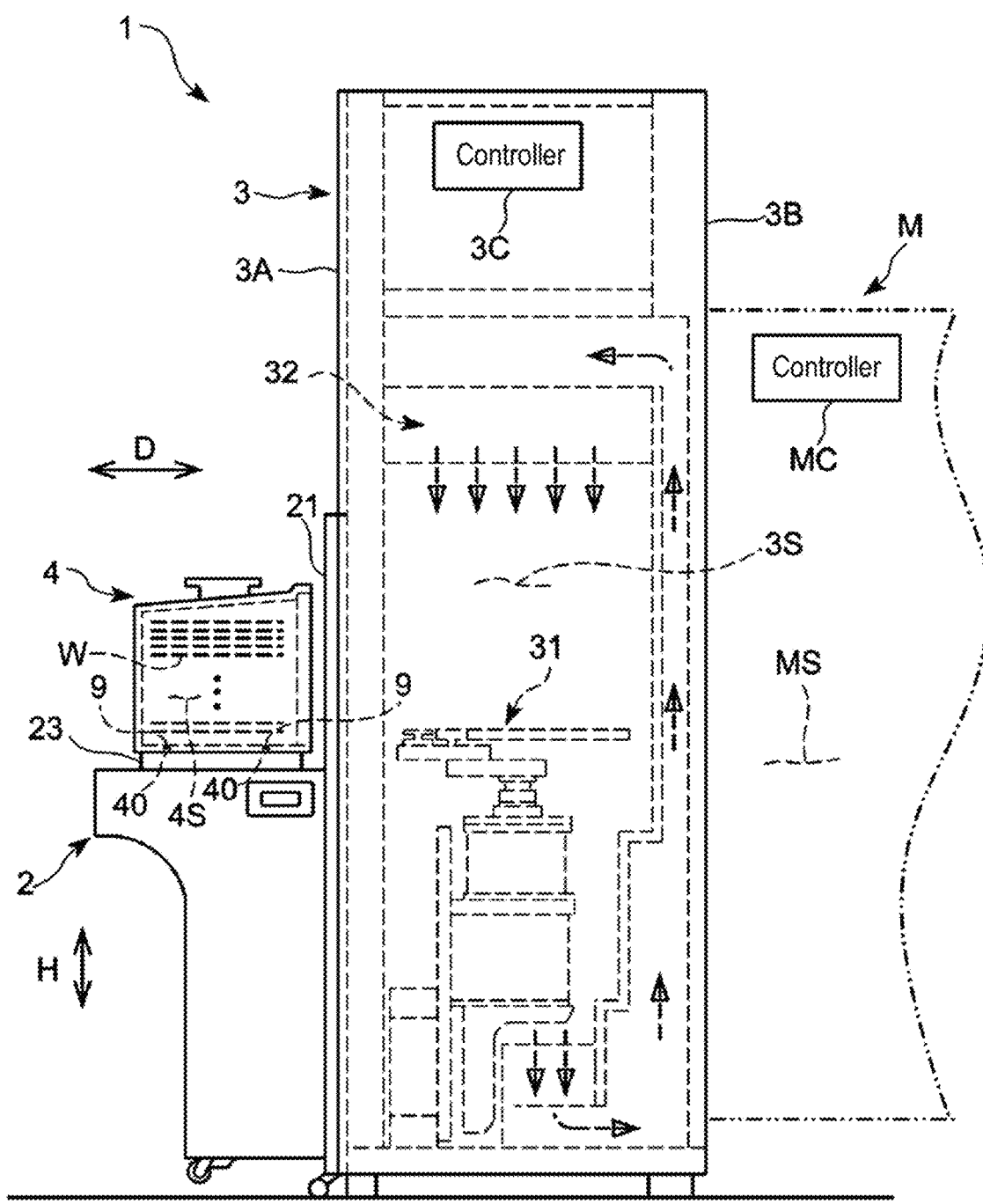
FIG. 2 is a side view schematically showing the relative positional relationship between an EFEM and its peripheral devices according to the first embodiment.

As shown in FIG. 2, in the semiconductor manufacturing process, the FOUP 4 is used together with an EFEM (Equipment Front End Module) including a load port 2 and a transfer chamber 3 disposed in a clean room. FIG. 2 schematically shows the relative positional relationship between the EFEM and its peripheral devices.

In an internal space 3S of the transfer chamber 3, there is provided a transfer robot 31 capable of transferring a wafer W as a substrate between the FOUP 4 and a processing apparatus M. By driving a fan filter unit 32 provided in the transfer chamber 3, a descending gas flow may be generated in the internal space 3S of the transfer chamber 3, and a gas (environmental gas) having a high degree of cleanliness may be circulated in the internal space 3S. For example, a processing apparatus M (semiconductor processing apparatus) is provided adjacent to a rear wall 3B of the transfer chamber 3 facing a front wall 3A where the load port 2 is disposed. In the clean room, the internal space MS of the processing apparatus M, the internal space 3S of the transfer chamber 3 and the internal space 4S of the FOUP 4 mounted on the load port 2 are maintained at a high degree of cleanliness. On the other hand, the space in which the load port 2 is disposed, in other words, the outside of the processing apparatus M or the outside of the EFEM, is maintained at a relatively low degree of cleanliness.

In the present embodiment, as shown in FIG. 2, the load port 2, the transfer chamber 3, and the processing apparatus M are sequentially disposed in close contact with each other in the front-rear direction D of the EFEM. The operation of the EFEM is controlled by a controller of the load port 2 (a controller 2C shown in FIG. 4) or a controller of the entire EFEM (a controller 3C shown in FIG. 2), and the operation of the processing apparatus M is controlled by a controller (a controller MC shown in FIG. 2) of the processing apparatus M. In this regard, the controller MC, which is a controller of the entire processing apparatus M, or the controller 3C, which is a controller of the entire EFEM, is a host controller of the controller 2C of the load port 2. The host system C constituting the substrate storage container management system 1 is constituted by a server and may be connected to a plurality of load ports 2 installed in a semiconductor manufacturing process. Each of these controllers 2C, MC and 3C is composed of an ordinary microprocessor which includes a CPU, a memory and an interface, etc. Programs necessary for processing are pre-stored in the memory. The CPU sequentially takes out and executes necessary programs, and cooperates with peripheral hardware resources to realize desired functions.

Figure 3:
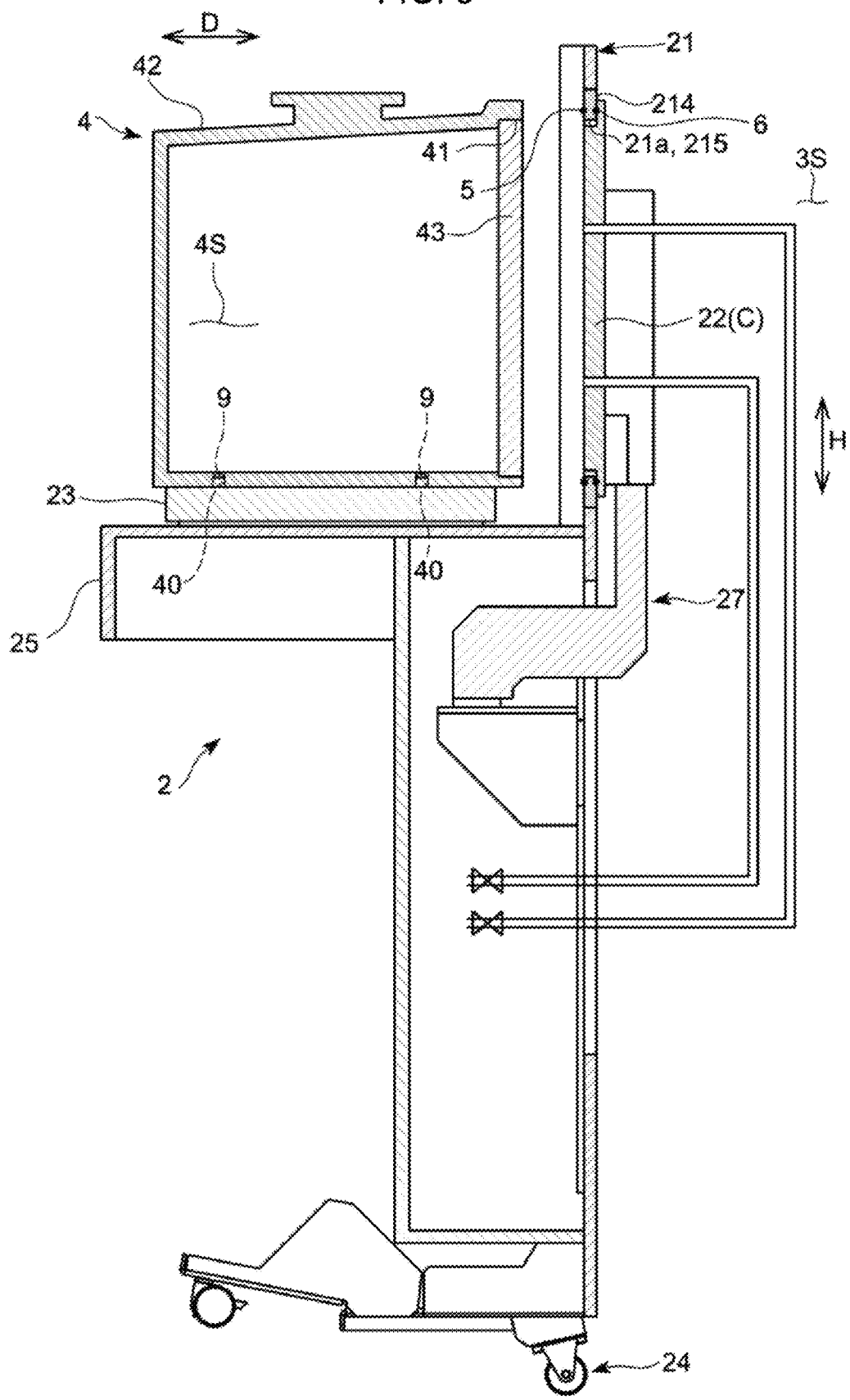
FIG. 3 is a view schematically showing a side cross section of a load port according to the first embodiment in which an FOUP is spaced apart from a base and a load port door is in a fully closed position.

As shown in FIGS. 2 and 3, the FOUP 4 includes a FOUP body 42 having an internal space 4S that can be opened through a loading/unloading port 41 as an opening, and a FOUP door 43 capable of opening and closing the loading/unloading port 41. The FOUP 4 is a known one configured to accommodate a plurality of wafers W in multiple stages in the vertical direction H and to allow the wafers W to be loaded or unloaded via the loading/unloading port 41.

The FOUP body 42 is provided with a shelf (wafer mounting shelf) on which the wafers W can be mounted at a predetermined pitch in multiple stages in the internal space 4S. On the bottom wall of the FOUP body 42, as shown in FIG. 3 and the like, ports 40 are provided at predetermined locations. Each of the ports 40 is mainly formed of, for example, a hollow cylindrical grommet seal fitted into a port attachment through-hole formed in the bottom wall of the FOUP body 42, and is configured to be opened and closed by a check valve. At the center of the upwardly facing surface of the upper wall of the FOUP body 42, there is provided a flange portion held by a container transfer device (for example, an OHT: Over Head Transport).

The FOUP door 43 faces a load port door 22 of the load port 2 in a state in which the FOUP 4 is mounted on a below-described mounting table 23 of the load port 2, and has a substantially plate shape. The FOUP door 43 is provided with a latch key (not shown) capable of locking the FOUP door 43 to the FOUP body 42. A gasket (not shown) is provided on a predetermined portion of the FOUP door 43 that remains in contact with or in proximity to the FOUP body 42 in a state in which the loading/unloading port 41 is closed by the FOUP door 43. By bringing the gasket into contact with the FOUP body 42 and elastically deforming the gasket, it is possible to seal the internal space 4S of the FOUP 4.

In the FOUP 4 according to the present embodiment, as shown in FIG. 1, the entity identification (ID) $4x$ is attached to an appropriate place. In FIG. 1, the entity identification (ID) $4x$ is schematically shown. Although an RFID (Radio Frequency Identifier) may be mentioned as an example of the entity identification (ID) $4x$, the present disclosure is not limited thereto. An appropriate ID may be used. The entity identification (ID) $4x$ attached to the FOUP 4 may be a passive tag, an active tag, or a semi-active tag (actuated active tag) obtained by combining the passive tag and the active tag. The communication method is not particularly limited. Furthermore, as the entity identification (ID) $4x$ attached to the FOUP 4, it may also be possible to use a one-dimensional barcode, or a two-dimensional barcode such as a QR code (registered trademark) or the like.

As shown in FIGS. 3 to 6 and the like, the load port 2 according to the present embodiment includes a plate-like base 21 constituting a part of the front wall 3A of the transfer chamber 3 and having an opening $21a$ for opening the internal space 3S of the transfer chamber 3, a load port door 22 configured to open and close the opening $21a$ of the base 21, and the mounting table 23 provided on the base 21 in a substantially horizontal posture.

Figure 7:
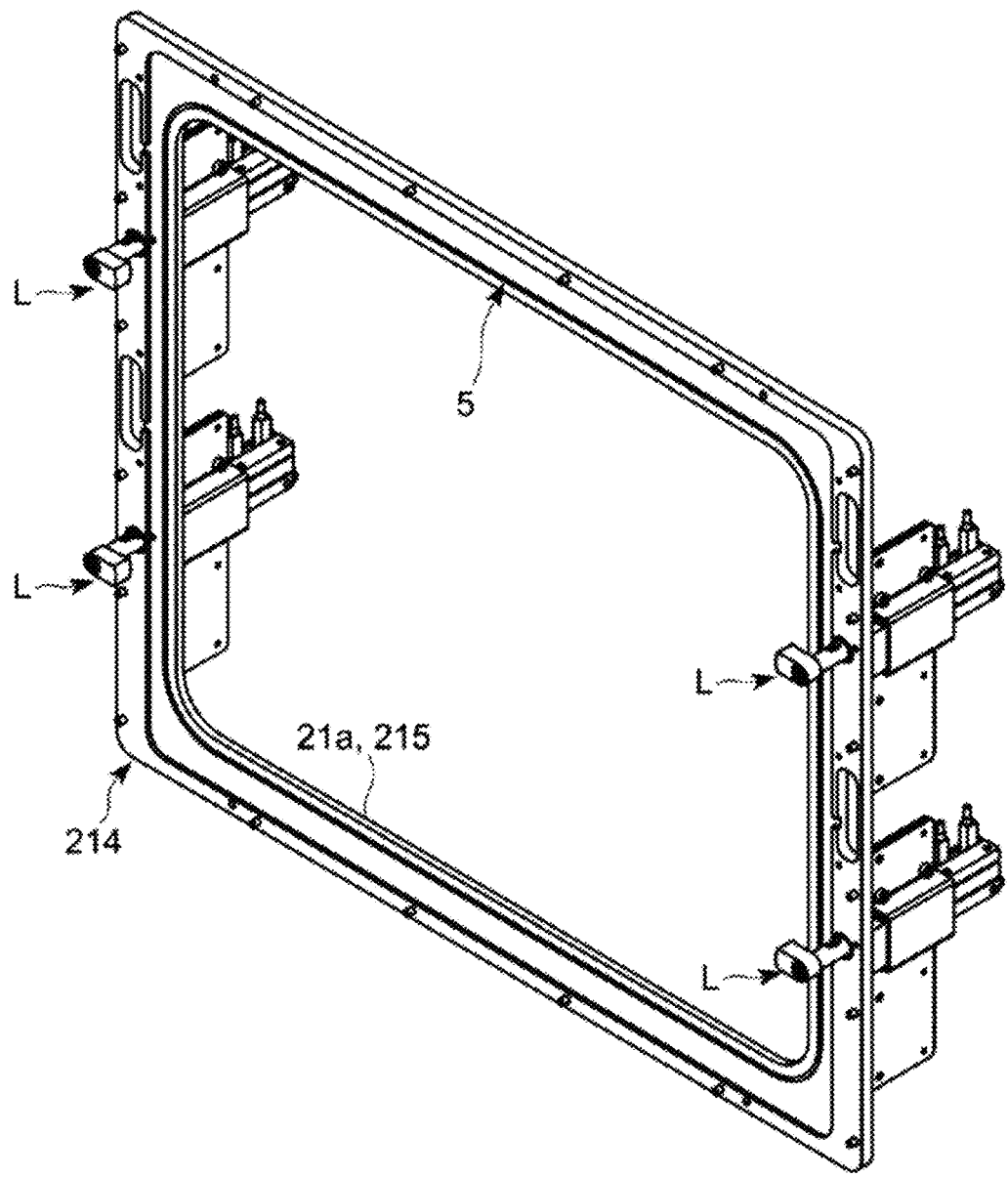
FIG. 7 is an overall perspective view of a window unit according to the first embodiment.

At the lower end of the base 21, there is provided a leg part 24 having a caster and an installation leg. A window unit 214 (see FIG. 7) is provided at a position facing the FOUP door 43. An opening 215 formed in the window unit 214 is an opening that allows the wafer W to pass therethrough.

Figure 4:
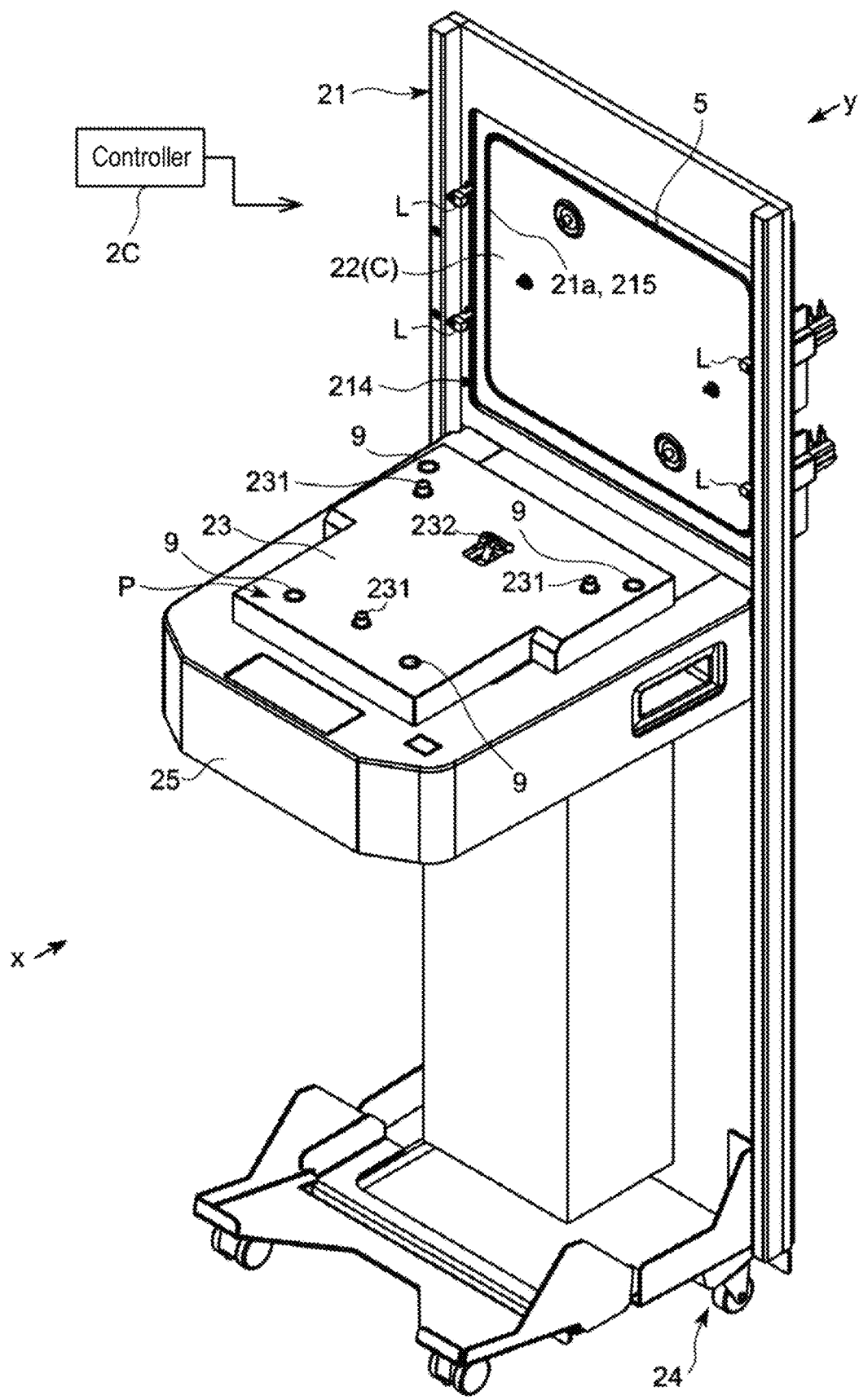
FIG. 4 is a perspective view showing a load port according to the first embodiment with a portion thereof omitted.
Figure 5:
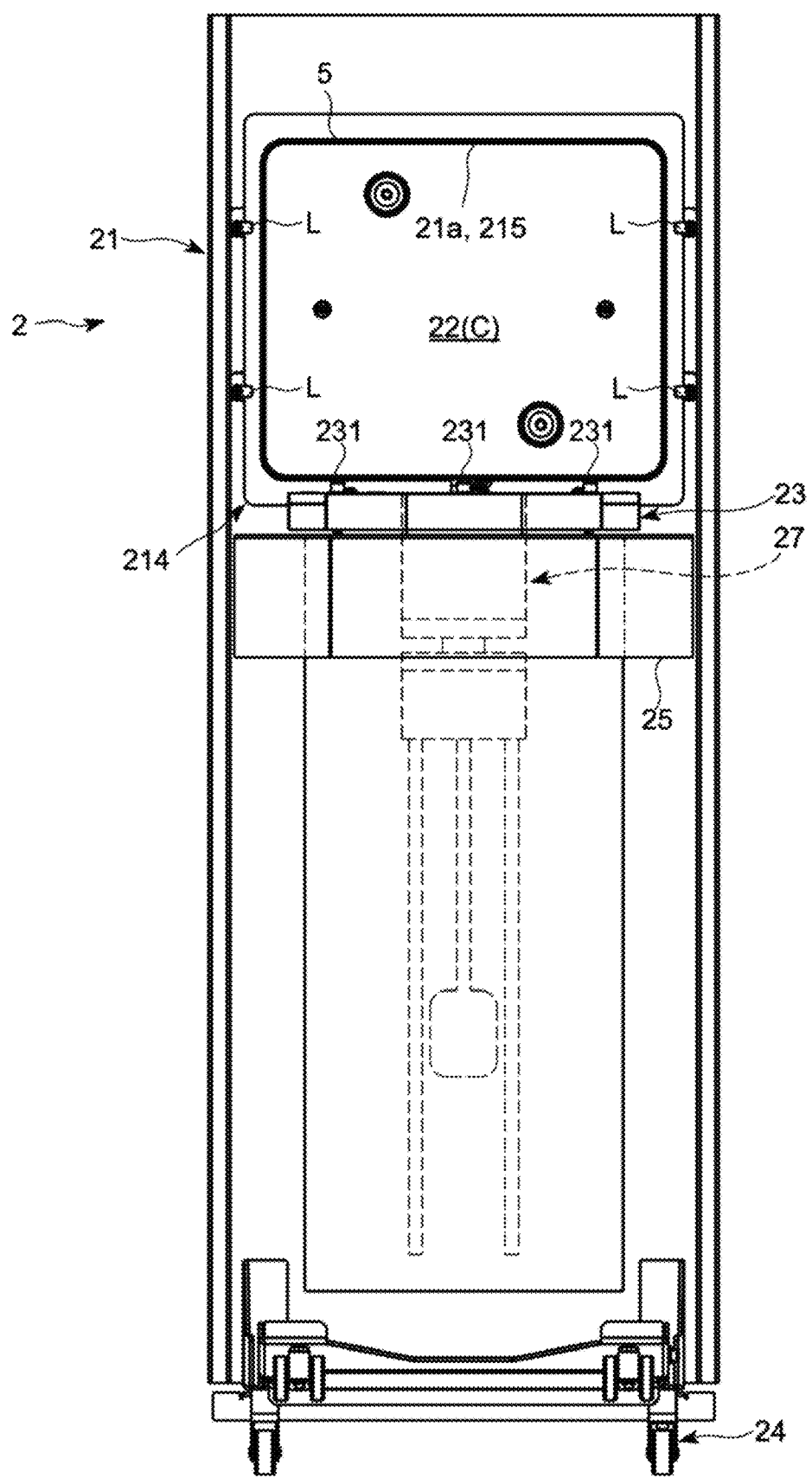
FIG. 5 is a view in the direction of an arrow x in FIG. 4.
Figure 6:
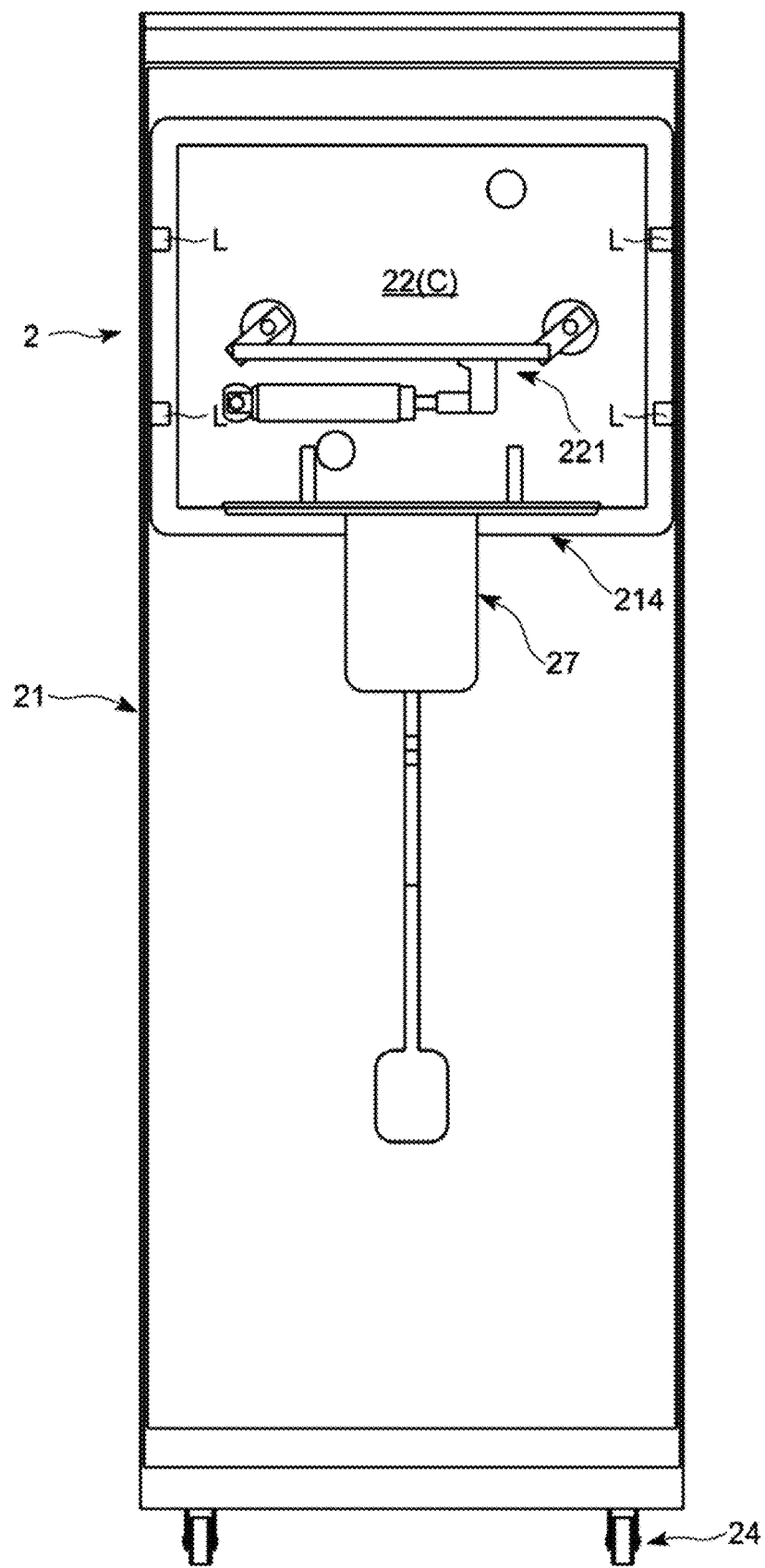
FIG. 6 is a view in the direction of an arrow y in FIG. 4.

The mounting table 23 is provided on an upper portion of a horizontal base 25 (support) which is disposed in a substantially horizontal posture at a position slightly above the height-direction center of the base 21. The mounting table 23 is capable of mounting the FOUP 4 in a direction in which the FOUP door 43, which can open and close the internal space 4S of the FOUP body 42, faces the load port door 22. Furthermore, the mounting table 23 is configured to be movable forward and backward with respect to the base 21 between a predetermined docking position (see FIG. 8) at which the FOUP door 43 is close to the opening $21a$ of the base 21 and a position (see FIG. 3) at which the FOUP door 43 is spaced apart by a predetermined distance from the base 21 as compared with the docking position. As shown in FIG. 4, the mounting table 23 has a plurality of protrusions (pins) 231 protruding upward. By bringing these protrusions 231 into engagement with holes (not shown) formed on the bottom surface of the FOUP 4, it is possible to perform the positioning of the FOUP 4 on the mounting table 23. In addition, there is provided a lock claw 232 for fixing the FOUP 4 to the mounting table 23. By establishing a lock state in which the lock claw 232 is hooked and fixed to a locked portion (not shown) provided on the bottom surface of the FOUP 4, it is possible to fix the FOUP 4 while guiding the FOUP 4 to a proper position on the mounting table 23 in cooperation with the positioning protrusions 231. In addition, by releasing the lock state of the lock claw 232 to the locked portion provided on the bottom surface of the FOUP 4, it is possible to establish a state in which the FOUP 4 can be spaced apart from the mounting table 23.

The load port door 22 includes a connection mechanism 221 (see FIG. 6) that can be switched between a lid connection state in which the connection mechanism 221 is connected to the FOUP door 43 to remove the FOUP door 43 from the FOUP body 42 and a lid connection release state in which the connection to the FOUP door 43 is released to attach the FOUP door 43 to the FOUP body 42. The load port door 22 is movable along a predetermined movement path while integrally holding the FOUP door 43 by the connection mechanism 221. The load port 2 of the present embodiment is configured so that the load port door 22 can be moved at least between a position shown in FIG. 8, i.e., a fully closed position (C) at which the internal space 4S of the FOUP body 42 is sealed by the FOUP door 43 held by the load port door 22, and a position shown in FIG. 9, i.e., an open position (O) at which the FOUP door 43 held by the load port door 22 is spaced apart from the FOUP body 42 to open the internal space 4S of the FOUP body 42 toward the inside of the transfer chamber 3. The load port 2 of the present embodiment is configured so that the load port door 22 located at the fully closed position (C) can be moved to the open position (O) shown in FIG. 9 while maintaining the upright posture of the load port door 22 and so that the load port door 22 can be moved downward from the open position (O) to a fully opened position (not shown) while maintaining the upright posture of the load port door 22. Such movement of the load port door 22 is realized by a door moving mechanism 27 provided in the load port 2. Furthermore, the load port 2 of the present embodiment includes a movement restraining part L which restrains the FOUP 4 on the mounting table 23 located at the docking position from moving in the direction in which the FOUP 4 is spaced apart from the base 21. In the present embodiment, the movement restraining part L is unitized as the window unit 214 (see FIG. 7).

The load port 2 of the present embodiment includes a purge device P that can inject a purge gas (mainly a nitrogen gas or a dry air) into the internal space 4S of the FOUP 4 and can replace a gas atmosphere in the internal space 4S of the FOUP 4 with the purge gas (see FIG. 4). The purge device P is provided with a plurality of purge nozzles 9 (gas supply/discharge devices) disposed at predetermined locations on the mounting table 23 in a state in which the upper end portions thereof can be exposed. These purge nozzles 9 are attached to appropriate positions on the mounting table 23 in a corresponding relationship with the positions of the ports 40 provided on the bottom surface of the FOUP 4 and can be connected to the ports 40 in contact with the ports 40. The bottom purge process using such a purge device P is a process that fills the inside of the FOUP 4 with a purge gas by allowing a predetermined number (excluding all) of the plurality of ports 40 provided at the bottom of the FOUP 4 to function as "supply ports", injecting an appropriate selected purge gas such as nitrogen gas, an inert gas or a dry air into the FOUP 4 by the purge nozzles 9 connected to the supply ports, allowing the remaining port 40 to function as an "exhaust port", and discharging the gas atmosphere in the FOUP 4 through the purge nozzle 9 connected to the exhaust port. The load port 2 includes a pressure sensor (not shown) that detects the gas pressure (exhaust pressure) in the purge nozzle 9 connected to the port 40 functioning as the exhaust port at the time of bottom purge processing.

Figure 10:
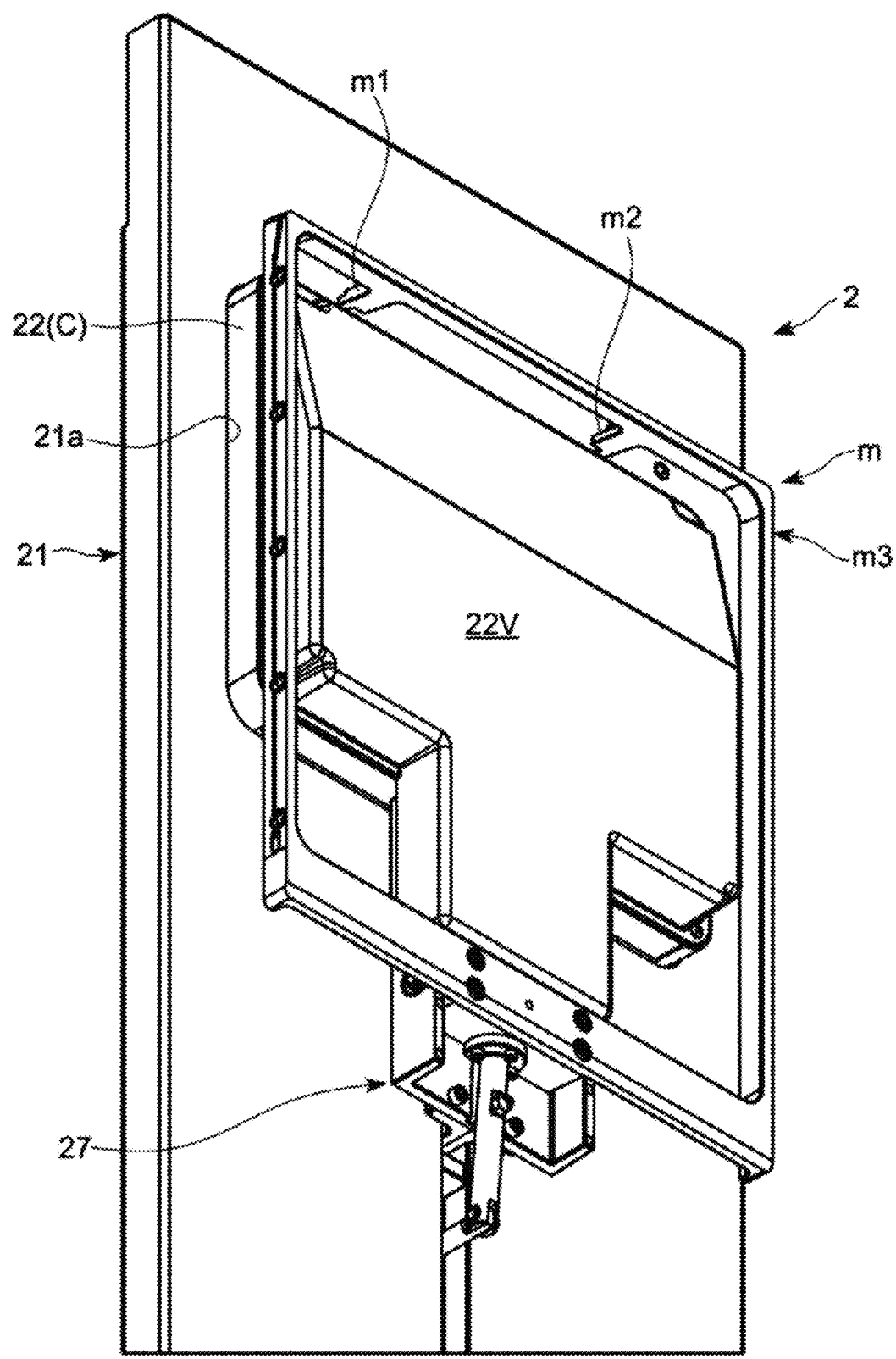
FIG. 10 is a view showing a mapping part according to the first embodiment.

As shown in FIG. 10, the load port 2 of the present embodiment includes a mapping part m capable of detecting the presence or absence of wafers W in the FOUP 4 or the storage posture of the wafers W. The mapping part m includes a mapping sensor (including a transmitter m1 and a receiver m2) capable of detecting the presence or absence of wafers W stored in multiple stages in the height direction H inside the FOUP 4, and a sensor frame m3 that supports the mapping sensor m1 and m2. The mapping part m is capable of being switched between a mapping retraction posture in which the mapping part m as a whole is disposed in the transfer space inside the transfer chamber and a mapping posture in which at least the mapping sensor m1 and m2 is positioned inside the FOUP 4 through the opening 21a of the base 21. The mapping part m is configured to be movable in the height direction H while maintaining the mapping retraction posture or the mapping posture. As shown in FIG. 10, a part of the sensor frame m3 is attached to a part of the door moving mechanism 27, whereby the vertical movement of the mapping part m is performed together with the vertical movement of the load port door 22. In addition, the mapping part m is omitted in each of FIG. 10 and subsequent figures.

The mapping sensor includes a transmitter m1 (light emission sensor) that emits a beam (ray) as a signal, and a receiver m2 (light reception sensor) that receives the signal emitted from the transmitter m1. Alternatively, the mapping sensor may be configured by a transmitter and a reflector that reflects the ray emitted from the transmitter toward the transmitter. In this case, the transmitter also serves as a receiver.

As shown in FIG. 1, the load port 2 according to the present embodiment includes an ID reader 2x capable of reading the entity identification (ID) 4x attached to the FOUP 4, and the load port communicator 2y capable of transmitting the entity identification (ID) 4x read by the ID reader 2x and the detected values (sensor values) of the sensors 2c (two types of sensors including a pressure sensor and a mapping sensor in the present embodiment) that directly or indirectly detect the state of the FOUP 4, to the host system C. The ID reader 2x, the pressure sensor, the mapping sensor, and the load port communicator 2y are respectively made of general-purpose products, and are provided at predetermined locations in the load port 2.

As shown in FIG. 1, the host system C includes a host system communicator Cx, an associator Cy, a database Cd, and a data processor Cz. The host system communicator Cx may receive the entity identification (ID) 4x and the sensor value transmitted from the load port communicator 2y. The associator Cy associates the sensor value with the entity identification (ID) 4x received by the host system communicator Cx. The database Cd stores and accumulates the data associated by the associator Cy, and the data processor Cz analyzes the data in the database Cd and outputs the state for each entity identification (ID) 4x (the prediction result of the replacement time of the FOUP 4 in the present embodiment). The host system communicator Cx, the associator Cy, and the database Cd may be configured using general-purpose products. Specific processing contents in the data processor Cz will be described later.

Next, the operation flow of the substrate storage container management system 1 according to the present embodiment will be described along with the operation flow of the EFEM.

First, the FOUP 4 is transported to the upper side of the load port 2 by a container transfer device such as an OHT or the like and mounted on the mounting table 23. At this time, for example, the positioning protrusions 231 provided on the mounting table 23 are fitted into the positioning recesses of the FOUP 4, and the lock claw 232 on the mounting table 23 is brought into a locked state (locking process). In the present embodiment, the FOUP 4 may be mounted on each of the mounting tables 23 of three load ports 2 arranged side by side in the width direction of the transfer chamber 3. Furthermore, the mounting of the FOUP 4 at a regular position on the mounting table 23 is detected by a seating sensor (not shown) for detecting whether or not the FOUP 4 is mounted at a predetermined position on the mounting table 23.

In the load port 2 of the present embodiment, when the FOUP 4 is mounted at the normal position on the mounting table 23, it may be detected that the bottom surface portion of the FOUP 4 presses, for example, a pressed portion of a pressure sensor provided on the mounting table 23. In response to this, the purge nozzles 9 (all the purge nozzles 9) provided on the mounting table 23 are moved upward beyond the upper surface of the mounting table 23 and are connected to the ports 40 of the FOUP 4, whereby the ports 40 are switched from the closed state to the open state. Then, the load port 2 of the present embodiment performs a process (bottom purge process) in which a nitrogen gas is supplied to the internal space 4S of the FOUP 4 by the purge device P to replace the internal space 4S of the FOUP 4 with the nitrogen gas. During the bottom purge process, the gas atmosphere in the FOUP 4 is exhausted to the outside of the FOUP 4 from the purge nozzle 9 connected to the port 40 functioning as an exhaust port. By virtue of such a bottom purge process, the moisture concentration and the oxygen concentration in the FOUP 4 are reduced to predetermined values or less, respectively, whereby the ambient environment of the wafers W in the FOUP 4 is converted to a low humidity environment and a low oxygen environment.

Figure 8:
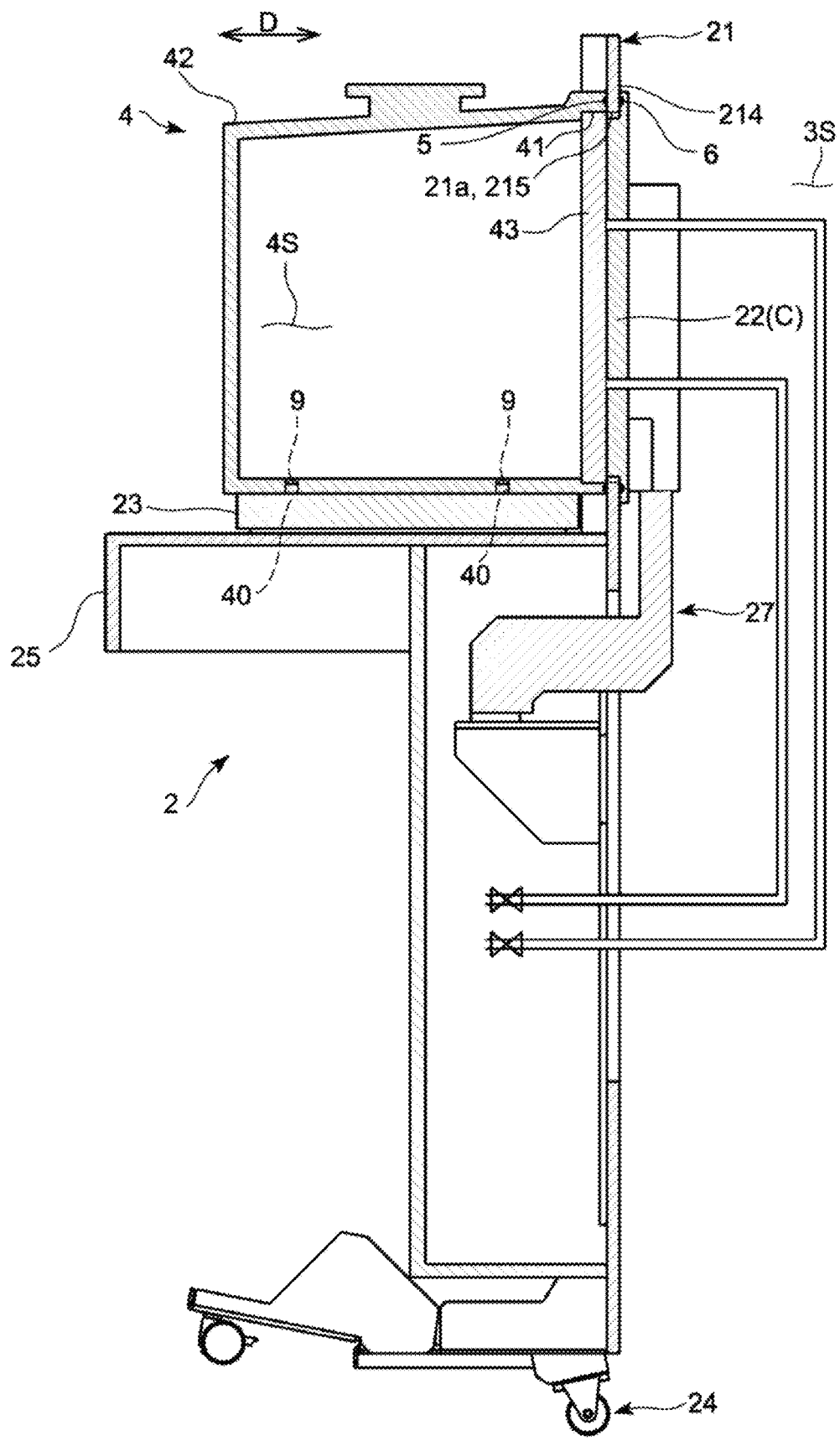
FIG. 8 is a view corresponding to FIG. 3 and showing a state in which the FOUP is close to the base and the load port door is in the fully closed position.
Figure 9:
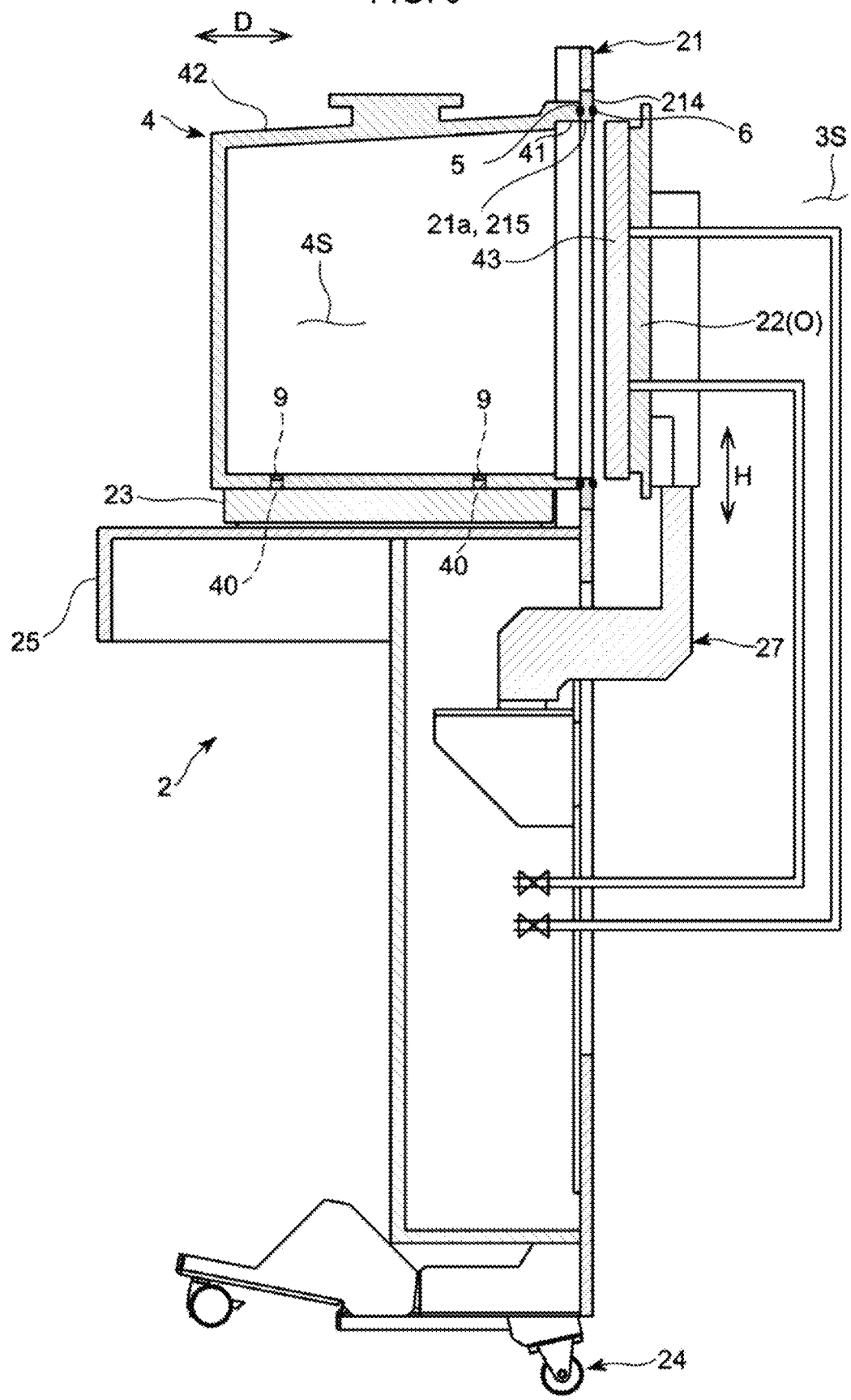
FIG. 9 is a view corresponding to FIG. 3 and showing a state in which the load port door is in an open position.

After the locking process, the load port 2 of the present embodiment performs a process of moving the mounting table 23 existing at the position shown in FIG. 2 to the docking position shown in FIG. 8 (docking process), a process of holding and fixing at least both sides of the FOUP 4 through the use of the movement restraining part L (clamping process), a process of switching the connection mechanism 221 to the lid connection state (lid connecting process), and a process of releasing the sealed state of the FOUP 4 by moving the FOUP door 43 together with the load port door 22 to open the opening 21a of the base 21 and the loading/unloading port 41 of the FOUP 4 (sealing releasing process). The load port 2 of the present embodiment performs a mapping process through the use of the mapping part m during the process of moving the load port door 22 from the open position (O) to the fully opened position. The mapping process is a process in which the mapping part m having kept in the mapping retraction posture until immediately before performing the sealing releasing process is switched to the mapping posture after the load port door 22 is moved from the fully closed position (C) to the open position (O), the load port door 22 is moved downward toward the fully opened position, the mapping part m is also moved downward while maintaining the mapping posture, and the presence or absence and the storage posture of the wafers W stored in the FOUP 4 are detected using the mapping sensor m1 and m2. That is to say, the signal path formed between the transmitter m1 and the receiver m2 by transmitting a signal from the transmitter m1 to the receiver m2 is interrupted at a location where the wafer W exists, and is not interrupted at a location where the wafer W does not exist, so that the signal reaches the receiver m2. Thus, the presence or absence and the storage posture of the wafers W stored side by side in the height direction H inside the FOUP 4 can be sequentially detected.

By performing the sealing releasing process, the internal space 4S of the FOUP body 42 and the internal space 3S of the transfer chamber 3 are in communication with each other. Based on the information (wafer position) detected in the mapping process, the transfer robot 31 provided in the internal space 3S of the transfer chamber 3 performs a process of taking out the wafer W from a specific wafer placement shelf, or storing the wafer W in a specific wafer placement shelf (transfer process).

When all the wafers W in the FOUP 4 have been processed by the processing apparatus M, the load port 2 according to the present embodiment performs a process of sealing the internal space 4S of the FOUP 4 by moving the load port door 22 to the fully closed position (C) through the use of the door moving mechanism 27 to close the opening 21a of the base 21 and the loading/unloading port 41 of the FOUP 4 (sealing process), and then performs a process of switching the connection mechanism 221 from the lid connection state to the lid connection release state (lid connection releasing process). By virtue of this process, the FOUP door 43 can be attached to the FOUP body 42. The opening 21a of the base 21 and the loading/unloading port 41 of the FOUP 4 are closed by the load port door 22 and the FOUP door 43, respectively. Thus, the internal space 4S of the FOUP 4 comes into a sealed state.

Subsequently, the load port 2 according to the present embodiment performs a clamp releasing process of releasing the fixed state (clamped state) of the FOUP 4 caused by the movement restraining part L, and then performs a process of moving the mounting table 23 in a direction away from the base 21 (undocking process). Thereafter, the load port 2 releases the state in which the FOUP 4 is locked by the lock claw 232 on the mounting table 23 (unlocking process). As a result, the FOUP 4 that stores the wafers W for which predetermined processing has been completed is delivered from the top of the mounting table 23 of each load port 2 to the container transfer device and is carried out to the next process.

In the course of performing the above process, the substrate storage container management system 1 according to the present embodiment outputs the state of the FOUP 4 mounted on the mounting table 23 of the load port 2 (specifically, the management system 1 predicts the replacement time of the FOUP 4). That is to say, the substrate storage container management system 1 according to the present embodiment reads the entity identification (ID) 4x of the FOUP 4 by the ID reader 2x of the load port 2 when the FOUP 4 is set on the mounting table 23 of the load port 2. The entity identification (ID) 4x thus read is transmitted to the associator Cy of the host system C by the load port communicator 2y. Then, when performing the process of purging the inside of the FOUP 4 (bottom purge process), the substrate storage container management system 1 according to the present embodiment detects the pressure of the exhaust gas using the pressure sensor provided in association with the exhaust purge nozzle 9 of the load port 2, and transmits the detected value (pressure value) to the associator Cy of the host system C.

The host system C receives the entity identification (ID) 4x and the pressure value using the host system communicator Cx, associates the entity identification (ID) 4x with the pressure value using the associator Cy, and preserves (stores and accumulates) the associated data in the database Cd. Furthermore, at the time of the mapping process performed by the mapping part m, the substrate storage container management system 1 according to the present embodiment transmits the wafer position, which is the detected value of the mapping sensor, to the associator Cy of the host system C using the load port communicator 2y. The host system C receives the wafer position using the host system communicator Cx, associates the entity identification (ID) 4x with the wafer position using the associator Cy, and preserves (stores and accumulates) the associated data in the database Cd.

As a result, in the host system C, the detected values of the various sensors provided in the load port 2 (the pressure value of the pressure sensor and the wafer position of the mapping sensor in the present embodiment) are associated with the entity identification (ID) 4x assigned to the FOUP 4 to create a database. In the present embodiment, as in the table of FIG. 13, the measurement date and time are stored together with the entity identification (ID) 4x for each FOUP 4, the pressure value of the pressure sensor (exhaust nozzle pressure value of FIG. 13), and the wafer position of the mapping sensor (FOUP wafer position of FIG. 13). Then, the data processor Cz of the host system C analyzes the collected data and predicts the replacement time of the FOUP 4. In addition, the expansion of a gap between the loading/unloading port 41 of the FOUP 4 and the FOUP door 43 may be determined based on the change in the pressure value of the exhaust gas detected by the pressure sensor provided in association with the exhaust purge nozzle 9 of the load port 2. That is to say, if it is found that the pressure of the gas exhausted from the exhaust purge nozzle 9 is low, it is understood that the exhaust amount through the gap between the loading/unloading port 41 of the FOUP 4 and the FOUP door 43 is large. It can be determined that the gap between the loading/unloading port 41 of the FOUP 4 and the FOUP door 43 is wide, which makes it possible to specify the deformation of the FOUP 4. Furthermore, as described above, when the detected value of the mapping sensor is different from the previous detected value (when the positional displacement of the wafer W is generated), it can be considered that the FOUP 4 is deformed and the position of the wafer W is changed. That is to say, the gap between the wafers W stored in multiple stages inside the FOUP 4 is changed as the deformation of the FOUP 4 progresses. Therefore, the deformation of the FOUP 4 can be specified by detecting such a change, or the deformation of the FOUP 4 can be specified by detecting that the wafers W are stored in an inclined posture.

Figure 11A:
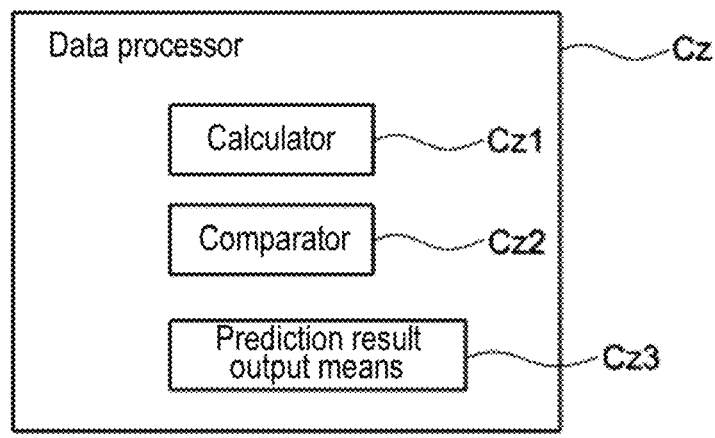

As shown in FIG. 11A, the data processor Cz in the present embodiment includes a calculator Cz1 for calculating statistical data from the sensor values (the pressure value and the wafer position) detected by specific sensors 2c (the pressure sensor and the mapping sensor in the present embodiment), a comparator Cz2 for comparing the sensor value associated with a specific entity identification (ID) 4x and the calculation result obtained by the calculator Cz1, and a prediction result output means Cz3 for calculating the replacement time of the FOUP 4 based on the comparison result obtained by the comparator Cz2 and outputting a prediction result. That is to say, the data processor Cz in the present embodiment predicts the replacement time of the FOUP 4 based on the numerical values obtained by averaging the data stored and accumulated in the database Cd for each of the various sensors. In this regard, the "prediction result output means Cz3" corresponds to the "state output means for outputting the state of the substrate storage container based on the result obtained by the comparator" in the present disclosure. The "prediction result output means Cz3" is an example of the "state output means".

Figure 12A:
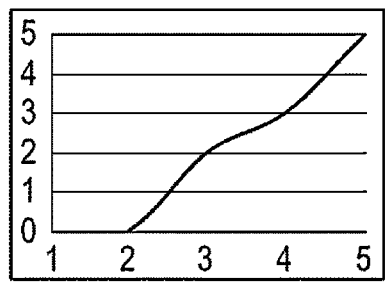
Figure 12B:
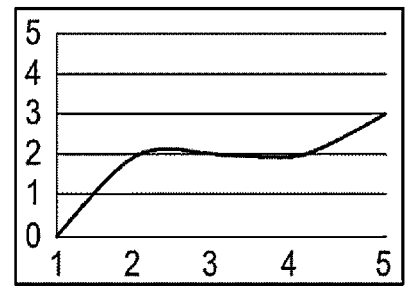

Specifically, as shown in the flowchart of FIG. 11B, the calculator Cz1 of the data processor Cz performs a process of acquiring data for each entity identification (ID) 4x of the FOUP 4 from the database Cd and graphing various sensor values for each entity identification (ID) 4x, and a process of averaging the graphed sensor values (sensor value graphs) of each entity identification (ID) 4x for each type of sensor, i.e., a process of creating a sensor value average graph for each type of sensor 2c (a process of calculating statistical data). FIG. 12A shows an example of a "sensor value graph" regarding "a sensor value of a first sensor" (for example, the pressure value of the pressure sensor) associated with the entity identification (ID) "A". FIG. 12B shows an example of a "sensor value graph" regarding "a sensor value of a second sensor" (for example, the wafer position of the mapping sensor) associated with the entity identification (ID) "A". Furthermore, FIG. 12C shows an example of "a sensor value graph" regarding "a sensor value of a first sensor" associated with the entity identification (ID) "A", "a sensor value graph" regarding a sensor value of a first sensor associated with the entity identification (ID) "B", and "a sensor value average graph regarding a first sensor" created based on these "sensor value graphs".

Subsequent to the process of creating the sensor value average graph, the comparator Cz2 of the data processor Cz analyzes (compares and reviews) the sensor value average graph and the sensor value graph created for each entity identification (ID) 4x. The analysis in this case may include, for example, a process of calculating and determining a degree of deviation of the sensor value to be compared with the sensor value average graph, or a degree of approach of the sensor value to a set threshold value (or whether the sensor value exceeds a threshold value). FIG. 12D shows, side by side, the sensor value average graph of the first sensor and the sensor value graph regarding the sensor value of the first sensor associated with the entity identification (ID) "A".

Then, the prediction result output means Cz3 of the data processor Cz analyzes (compares and reviews) the replacement time prediction result based on the detected values of various sensors for the same entity identification (ID) 4x, predicts the replacement time for each entity identification (ID) 4x (for each FOUP 4), and outputs a prediction result. In this case, it is possible to perform a process of setting a priority (weighting value) for each type of sensor, or calculating an average value. That is to say, when the predicted replacement time is different for each type of sensor (for example, when the replacement time based on the detected value of the first sensor is April 23 and the replacement time based on the detected value of the second sensor is April 25), the earliest predicted replacement time (April 23) may be outputted as the predicted replacement time of the FOUP, or the average or mean value (April 24) of the predicted replacement times of the respective sensors may be outputted as the predicted replacement time of the FOUP, or the latest predicted replacement time (April 25) may be outputted as the predicted replacement time of the FOUP. In addition, instead of setting the aforementioned weight value or calculating the average value, a threshold value of the sensor value, the number of times of use of the FOUP 4, or the like may be arbitrarily set and the replacement time of the FOUP 4 may be outputted when it falls outside the set threshold or the number of times of use of the FOUP 4.

The replacement time prediction result for each entity identification (ID) 4x (for each FOUP 4) outputted by the data processor Cz may be displayed on, for example, a display that can be visually recognized by the user, or may be emitted and notified as a sound from an appropriate speaker or the like. This enables the user to grasp the replacement time prediction result for the FOUP 4.

According to the substrate storage container management system 1 and the substrate storage container management method of the present embodiment, the entity identification (ID) 4x assigned to the FOUP 4 already used in many manufacturing sites and the detected value obtained by the sensor 2c provided in the load port 2 are associated in the host system C to create a database, the data in the database Cd is analyzed by the data processor Cz of the host system C, and the state of the FOUP 4 for each entity identification (ID) 4x (specifically, the prediction result of the replacement time) is outputted, whereby deterioration information of the FOUP 4 can be acquired. By utilizing the substrate storage container management system 1 according to the present disclosure, the user can grasp the replacement time of each FOUP 4 predicted based on the detected value of the sensor 2c provided in the load port 2. Then, by replacing the FOUP 4 close to the replacement time or the FOUP 4 having reached the replacement time with a new FOUP 4, it is possible to prevent or suppress a problem caused by the deformation or distortion of the FOUP 4, i.e., a problem that a gap between the loading/unloading port 41 and the FOUP door 43 of the FOUP 4 grows larger and a gas flows into or leaks from the FOUP 4 through the gap. After the purge process of replacing the gas in the FOUP 4 with a nitrogen gas, it is possible to maintain the inside of the FOUP 4 at a low oxygen concentration for a predetermined period of time by preventing a situation that the nitrogen gas flows from the inside of the FOUP 4 to the outside of the FOUP 4 or the atmosphere (oxygen) flows into the FOUP 4. It is possible to prevent or suppress a situation that the surfaces of the wafers accommodated in the FOUP 4 are oxidized. As a result, it is possible to reduce the frequency of occurrence of errors due to the deformation of the FOUP 4. Thus, the down time of the semiconductor manufacturing apparatus is shortened, and the productivity is improved.

In particular, considering that the task of providing instruments such as a sensor and the like in all the FOUPs 4 is onerous and complex, the substrate storage container management system 1 and the substrate storage container management method according to the present embodiment are advantageous in that it is only necessary to assign an entity identification (ID) 4x to the currently available FOUP 4 and in that it is not necessary to mount a sensor power supply on each FOUP 4 as compared with an embodiment in which a sensor is provided for each FOUP 4 as described as the prior art. There is no need to newly prepare a dedicated substrate storage container applicable to the substrate storage container management system 1 and the substrate storage container management method. Thus, the substrate storage container management system 1 and the substrate storage container management method can be easily introduced into the manufacturing sites (manufacturing lines).

In addition, the substrate storage container management system 1 and the substrate storage container management method according to the present embodiment are advantageous in that, by setting the installation target of the sensor to the load port 2, as compared with an embodiment in which a sensor is provided for each FOUP 4 as described as the prior art, it is possible to reduce the absolute number of sensors subjected to maintenance and to alleviate the burden of maintenance and it is not necessary to pay attention to the failure of instruments such as a sensor and the like caused by the heat or water intrusion at the time of cleaning the FOUP 4 with hot water. Furthermore, the power supply to the ID reader 2x, the sensor 2c and the load port communicator 2y of the load port 2 can be relatively easily performed using the electrical system of the load port 2.

Moreover, according to the substrate storage container management system 1 and the substrate storage container management method of the present embodiment, it is possible to predict the demand of the substrate storage container. That is to say, from the result of prediction of the replacement time of the FOUP 4 as a substrate storage container, the number of FOUPs 4 predicted to be replaced (discarded) at the replacement time can be predicted as the number of new FOUPs 4 to be introduced. Furthermore, according to the substrate storage container management system 1 and the substrate storage container management method of the present embodiment, it is considered that the data collected in the database Cd can be used as big data, and the cause of deterioration of the substrate storage container can be pursued by data mining.

In addition, as in the second embodiment described below, machine learning may be used to analyze the data stored in the database Cd.

Figure 14:
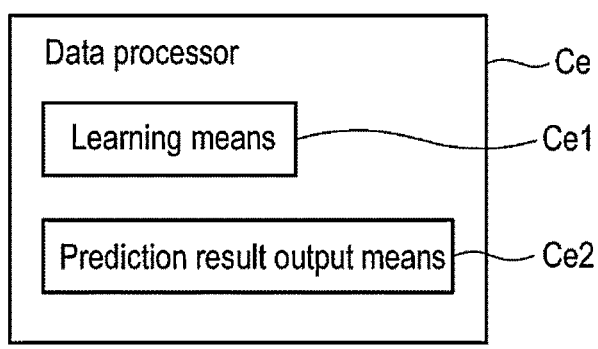
FIG. 14 is a functional block diagram of a data processor according to a second embodiment of the present disclosure.

In the first embodiment, the data processor Cz of the host system C is configured as shown in FIG. 11A. However, in the second embodiment, the data processor Ce shown in FIG. 14 is used. The configurations other than the data processor Ce are the same as those of the first embodiment and, therefore, the detailed description thereof is omitted.

In the present embodiment, as in the first embodiment (FIG. 1), in the course of opening or closing the FOUP door 43 with respect to the FOUP 4 by the load port 2, the state of the FOUP 4 is directly or indirectly detected using a single sensor 2c or a plurality of sensors 2c. Furthermore, the sensor value detected by the sensor 2c is preserved (stored or accumulated) in the database Cd of the host system C. The data preserved in the database Cd is stored as a record in which, as in the table shown in FIG. 13, the entity identification (ID) 4x and the sensor value detected by the sensor 2c are associated by the associator Cy and the measurement date and time is given. The data preserved in the database Cd is processed and analyzed by the data processor Ce shown in FIG. 14 and is used for prediction and maintenance of the state of the FOUP 4, the replacement time prediction or the like.

The specific configuration of the data processor Ce will be described below. The data processor Ce includes a learning means Ce1 and a prediction result output means Ce2 as shown in the block diagram of FIG. 14. The learning means Ce1 is composed of, for example, a neural network.

Hereinafter, a procedure for constructing a learned model by the learning means Ce1 of the data processor Ce of the present embodiment will be described. First, the time series data of the sensor value of the sensor 2c for each FOUP 4 and the date on which the FOUP 4 is actually deteriorated or deformed and becomes unusable are extracted from the database Cd and are inputted to the neural network of the learning means Ce1. Then, in the neural network, various parameters are updated according to the inputted data, and learning proceeds. A learned model is constructed by repeating this process.

If the data for each FOUP 4 preserved in the database Cd is inputted to the learned model constructed according to the above procedure, it is possible to estimate the state of the FOUP 4 and to output the prediction result of the replacement time. Therefore, the state of the FOUP 4 and the replacement time prediction outputted from the learned model are outputted using the prediction result output means Ce2.

In the present embodiment, the learned model is constructed using the neural network. However, it is also possible to use other methods. Although the supervised learning is used in the present embodiment, unsupervised learning may be used. It may also be possible to use an algorithm that updates the learned model as needed. Furthermore, in the present embodiment, the date and time at which the FOUP 4 becomes unusable is extracted from the database Cd to construct the learned model. However, a learned model may be constructed using the data available when the FOUP 4 can be normally used, and prediction and maintenance may be performed.

Furthermore, as in the third embodiment described below, the operation of the load port 2 may be adjusted for each FOUP 4 using the state of the FOUP 4 for each entity identification (ID) $4x$ outputted by the data processor Cz and other data preserved in the database Cd.

Figure 15:
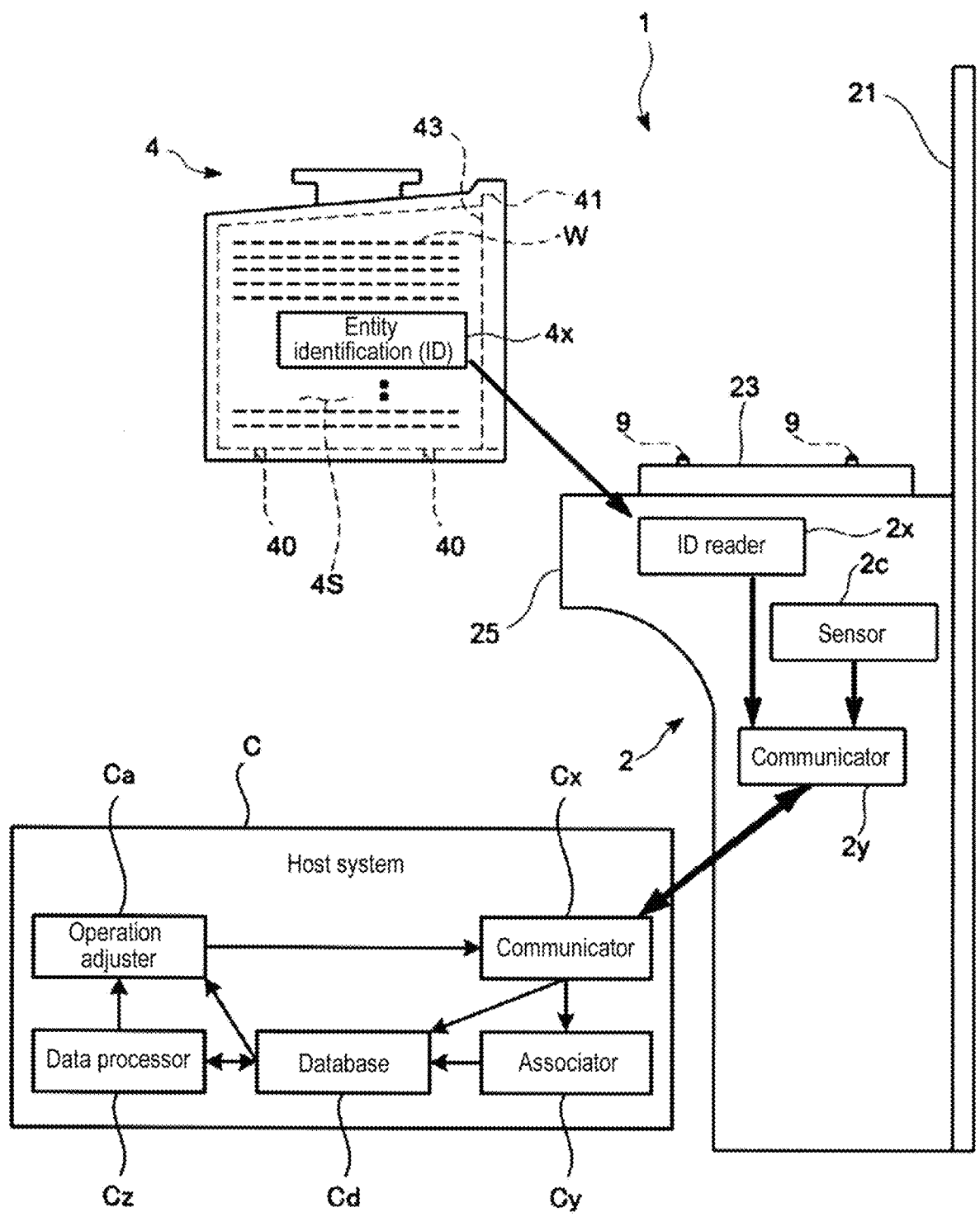
FIG. 15 is a block diagram of a substrate storage container management system according to a third embodiment of the present disclosure.

The host system C of the first embodiment is configured as shown in FIG. 1. However, in the third embodiment, the host system C shown in FIG. 15 is used. The configuration of the load port 2 is the same as that of the first embodiment and, hence, the detailed description thereof is omitted.

As shown in FIG. 15, the host system C of the present embodiment includes a host system communicator Cx, an associator Cy, a database Cd, a data processor Cz, and an operation adjuster Ca. The host system communicator Cx may bilaterally transmit and receive data signals to and from the load port communicator $2y$ and may receive the entity identification (ID) $4x$ read by the ID reader $2x$ of the load port 2 and the sensor value detected by the sensor $2c$. The sensor value to be received may be one type or plural types. The associator Cy associates the entity identification (ID) $4x$ and the sensor value with each other. The database Cd stores and accumulates the data associated by the associator Cy. Just like the first embodiment (see FIG. 13), in the database Cd, the data given measurement date and time is accumulated in the data in which the entity identification (ID) $4x$ and the sensor value are associated with each other. The data processor Cz analyzes the data in the database Cd and outputs the state of each entity identification (ID) $4x$. In the present embodiment, the state of the FOUP 4 outputted by the data processor Cz is also associated with the entity identification (ID) $4x$ and is stored in the database Cd.

The processing procedure of the FOUP 4 performed by the load port 2 and the host system C of the present embodiment will be described. First, when the FOUP 4 is mounted on the mounting table 23 of the load port 2, the entity identification (ID) $4x$ of the FOUP 4 is read by the ID reader $2x$ of the load port 2. Next, the load port communicator $2y$ transmits the entity identification (ID) $4x$ of the FOUP 4 to the host system communicator Cx. In the host system C, the received state data of the FOUP 4 for the entity identification (ID) $4x$ is inquired to the database Cd, and the state data obtained as a result thereof is inputted to the operation adjuster Ca. The operation adjuster Ca adjusts the operation at the time of processing the FOUP 4 with the load port 2 in accordance with the state of the FOUP 4.

For example, in the case of the FOUP 4 whose deformation has not occurred yet, an instruction is transmitted to the load port 2 via the host system communicator Cx so as to perform processing as usual. In the case of the FOUP 4 in which deformation or deterioration has occurred, there is a high possibility that an error will be generated during the processing performed at the load port 2. Therefore, an instruction is transmitted to the load port 2 via the host system communicator Cx so as to, for example, set a higher number of retries when an error is generated. By setting the number of retries (corresponding to the "control value related to the processing of the substrate storage container" of the present disclosure) according to the state of the FOUP 4 as described above, even if the FOUP 4 has been deformed or deteriorated, it is possible to allow processing to proceed smoothly without frequently generating an error at the load port 2.

Furthermore, the data used when the operation adjuster Ca adjusts the control value may refer not only to the state of the FOUP 4 but also to other data. For example, the information on the error generated during the processing of the FOUP 4 at the load port 2 may be associated with an entity identification (ID) and preserved in the database Cd, and the operation adjuster Ca may adjust the operation of the load port 2 based on the information on the error preserved in the database Cd. Specifically, the operation adjuster Ca may calculate an error easily generated for each FOUP 4 and may adjust the operation of the load port 2 for each FOUP 4. As an example, in the case of the FOUP 4 in which an error is easily generated during the docking process between the load port door 22 and the FOUP 4, the operation of the load port 2 may be adjusted so that the pressure during the docking process between the load port 2 and the FOUP 4 (corresponding to the "control value on the processing of the substrate storage container" of the present disclosure) becomes a pressure higher than that of an ordinary docking process. By grasping the easily generated error and adjusting the operation of the load port 2 for each FOUP 4 in advance as described above, it is possible to prevent the generation of an error. In addition, various methods such as a statistical method, data mining, machine learning and the like may be used for the calculation of an error easily generated for each FOUP 4. Moreover, the calculation of an error easily generated for each FOUP 4 may be performed by a part other than the operation adjuster Ca. For example, the operation adjuster Ca may adjust the operation of the load port 2 by calculating an error easily generated for each FOUP 4 in the data processor Cd and inputting the calculation result to the operation adjuster Ca.

In addition, the information related to the processing performed on the wafer W stored in the FOUP 4 may be associated with the entity identification (ID) and preserved in the database Cd, and the operation adjuster Ca may adjust the operation of the load port 2 for each FOUP 4 based on the information related to the processing performed on the wafer W. For example, when the FOUP 4 storing the wafer W subjected to a heat treatment is processed at the load port 2 of the next process, the atmosphere in the FOUP 4 is cooled and the pressure in the FOUP 4 is changed during the transfer of the FOUP 4 to the load port 2 of the next process. In this case, the FOUP door 43 may not be easily opened and closed. Therefore, the number of retries (corresponding to the "control value related to the processing of the substrate storage container" of the present disclosure) may be made larger than an ordinary one. As described above, by adjusting the operation of the load port 2 with reference to the information on the processing of the wafer W performed in the previous process using the entity identification (ID) $4x$ when the FOUP 4 is mounted on the load port 2, it is possible to smoothly perform the processing without frequently generating an error at the load port 2.

In the present embodiment, the operation adjuster Ca adjusts the operation of the load port 2 using one of the state of the FOUP 4, the information on the error generated during the processing of the FOUP 4, and the information related to the processing performed on the wafer W stored in the FOUP 4. However, the operation of the load port 2 may be adjusted based on other kinds of information, or may be adjusted by combining plural kinds of information.

Although the embodiments of the present disclosure have been described above, the present disclosure is not limited to the configurations of the embodiments described above. For example, in the above-described embodiments, the associator Cy, the database Cd, the data processor Cz and the operation adjuster Ca are provided in the host system C different from the load port 2. However, it is not essential that these functional parts be provided in the host system C. For example, the associator Cy may be provided in the load port 2, and the entity identification (ID) 4x and the sensor value associated in advance in the load port 2 may be transmitted from the load port 2 to the host system C. The database Cd, the data processor Cz and the operation adjuster Ca may be similarly provided at the load port 2.

Moreover, in the above-described embodiments, there has been illustrated an example where the sensor values transmitted from the load port to the host system are sensor values of two types of sensors. However, the sensor value transmitted from the load port to the host system may be a sensor value of one type of sensor, or may be sensor values of three or more types of sensors. Furthermore, the installation location of the host system may be inside or outside a factory where semiconductor manufacturing is performed, and the data of a plurality of semiconductor manufacturing factories or a plurality of semiconductor manufacturing processes may be collectively managed or processed by a single host system. Moreover, it is also possible to distribute the functions of the host system to a plurality of computers or servers. The format of the data preserved in the database is not limited to the table described in the embodiments. The data may also be preserved in a format other than the table described in the embodiments. In addition, in the above-described embodiments, the time series of data is shown by attaching the measurement date and time to the data preserved in the database. However, the data may be replaced by another data from which the time series can be grasped.

Examples of the "sensor for directly or indirectly detecting the state of the FOUP" in the present disclosure are not limited to the above-described "exhaust nozzle pressure sensor" and the "mapping sensor", but may include a "sensor capable of directly or indirectly detecting the time taken for the container door (FOUP door) to move from the fully closed position to the open position" and a "torque sensor for measuring the rotational torque of a latch key of the container door (FOUP door)." By acquiring "the movement time of the container door (FOUP door) from the fully closed position to the open position" as data, it is possible to grasp whether or not the container door (FOUP door) is difficult to open. From the sensor value (data) in which the movement time of the container door (FOUP door) from the fully closed position to the open position is long, it is possible to determine an event that the container door (FOUP door) is difficult to open, i.e., a possibility that the substrate storage container is deformed. In addition, it may be possible to attach a sensor capable of measuring the torque or pressure necessary for docking the container door (FOUP door) and the load port door during the docking process of the FOUP.

In addition, by acquiring the "rotational torque value of a latch key of the container door (FOUP door)" as data, it is possible to grasp whether or not the latch key is difficult to rotate. From the data in which the rotational torque value is large, it is possible to determine an event that the latch key is difficult to rotate, i.e., a possibility that the substrate storage container is deformed.

Furthermore, as for the connection mechanism provided at the load port door to connect the container door (FOUP door) to the load port door, a sensor capable of detecting an appropriate connection state established by the connection mechanism may be provided at the load port, and the connection failure caused by the deformation of the substrate storage container may be estimated and determined according to a change in the detected value of the sensor. In addition, by acquiring a sensor value from a gauge for measuring an oxygen concentration in the exhaust gas exhausted from the exhaust nozzle, it is possible to estimate and determine how much the inflow of an ambient air due to the deformation of the substrate storage container affects the wafers contained in the substrate storage container. In addition, by detecting a lock error of the lock claw provided at the mounting table of the load port, it is possible to estimate the scraping of the locked portion (the portion engaging with the lock claw) provided on the bottom surface of the substrate storage container. In addition, the number of lock errors of the lock claw may be measured.

Furthermore, the data processor of the host system may be able to output the state of the substrate storage container (for example, predict the replacement time of the substrate storage container) by using a data mining method.

When the detection (measurement) of a tact time indicates that time is taken with respect to the standard tact time, if there is a tendency that time is taken just as much as a specific load port takes time, it is possible to determine that there is a time loss due to the load port. In other words, if the detected (measured) tact time is longer than the standard tact time, a time taken for a specific load port is also longer than times taken for other load ports, and how longer the tact time is tends to correspond to how longer the time taken for the specific load port is, then it is possible to determine that there is a time loss due to the specific load port.

Thus, a message prompting the adjustment of the load port is notified. If there is a tendency that time is taken even though a particular substrate storage container is placed on any load port, it is possible to determine that a time loss has occurred due to the substrate storage container. Thus, a message for checking the substrate storage container or a message prompting the replacement thereof may be notified. In addition, when a process of setting the gas supply amount to a larger value and increasing the internal pressure of the substrate storage container during the bottom purge process so that the container door (FOUP door) can be easily opened is performed by the operation adjuster with respect to the substrate storage container whose container door (FOUP door) cannot bet easily opened, the atmosphere in the substrate storage container is likely to leak to the outside. When a process in which the oxygen concentration around the load port may decrease is performed as described above, the fact may be notified to a worker.

In the above-described embodiments, the FOUP used for wafer transfer is adopted as the substrate storage container. However, in the present disclosure, it is also possible to use a substrate storage container other than the FOUP, for example, a MAC (Multi Application Carrier), an H-MAC (Horizontal-MAC), a FOSB (Front Open Shipping Box), or the like.

In the above-described embodiments, the nitrogen gas is illustrated as the environmental gas used for a bottom purge process or the like. However, the present disclosure is not limited thereto. It may be possible to use a desired gas (inert gas) such as a dry gas, an argon gas or the like.

Furthermore, the container door (FOUP door) may be temporarily kept in an inclined posture (with an operation of drawing a partial arc-like locus) in the process of moving from the fully closed position to the fully opened position.

In addition, the specific configurations of the respective parts are not limited to those of the above-described embodiments, and various modifications may be made without departing from the scope of the present disclosure.

According to the present disclosure in some embodiments, a substrate storage container management system capable of assigning an entity identification (ID) to a substrate storage container such as an FOUP or the like, associating a sensor value of a sensor provided at a load port with the entity identification (ID) using IoT (Internet of Things) to create a database, determining a deterioration state of the substrate storage container attributable to the use thereof based on the data of the database, and predicting a replacement timing of a substrate storage container can be realized by applying a generally used FOUP instead of a dedicated FOUP provided with instruments such as a sensor and the like. According to the present disclosure, it is possible to acquire information on deformation of the substrate storage container without requiring time to measure the shape of the substrate storage container. By specifying the substrate storage container to be replaced and replacing the specified substrate storage container with a new substrate storage container, it is possible to suppress oxidation of the surfaces of wafers stored in the substrate storage container.

Figure 16:
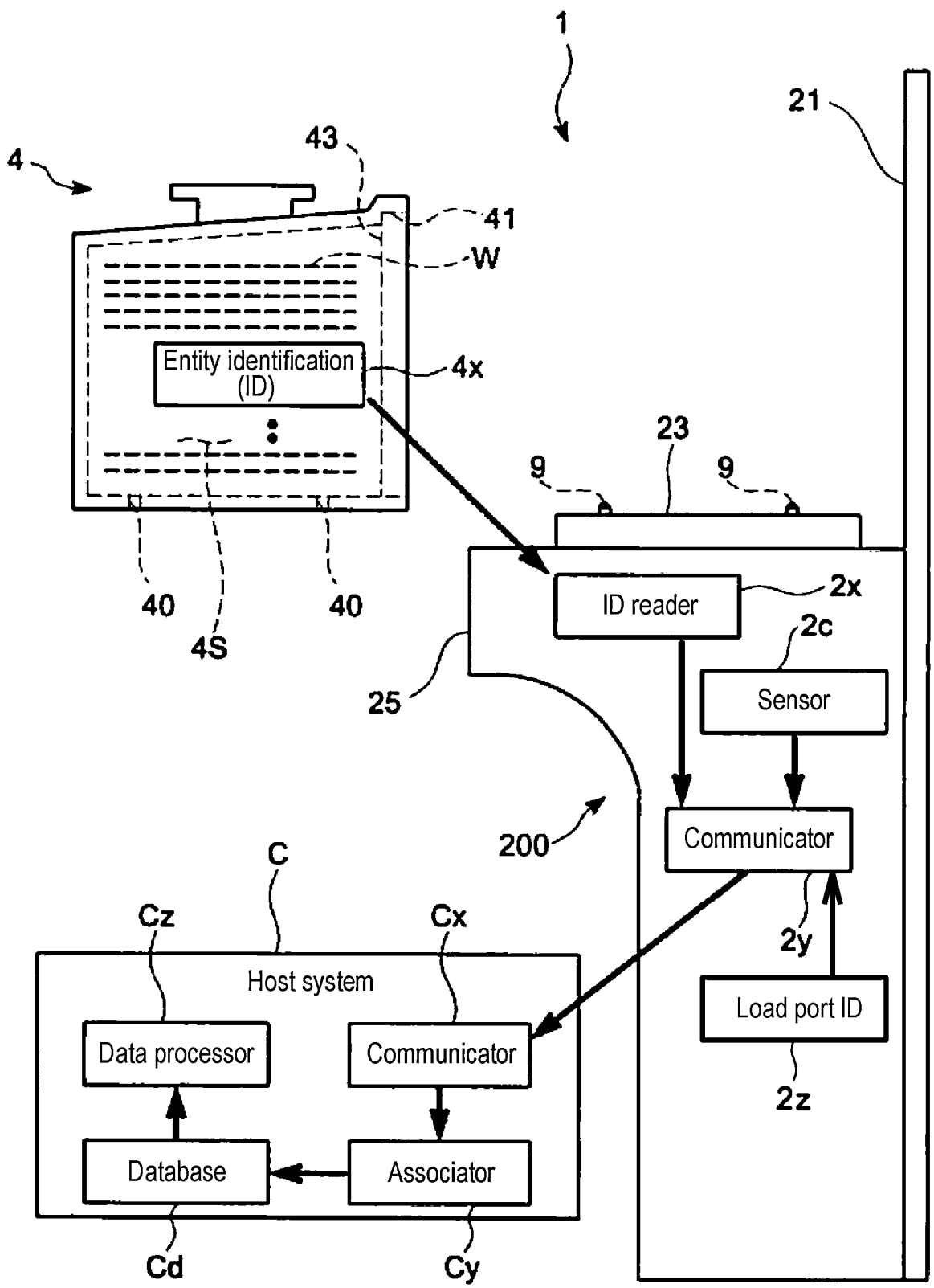
FIG. 16 is a block diagram of a substrate storage container management system according to a fourth embodiment of the present disclosure.

FIG. 16 illustrates a load port 200 according to a fourth embodiment of the present disclosure. The configurations of the host system C and the FOUP (or substrate storage container) 4 are the same as those of the first embodiment and, hence, the detailed description thereof is omitted. The load port 200 as shown in FIG. 16 includes an ID (identification) reader 2x, one or more sensors 2c, and a load port communicator 2y. This embodiment may be implemented by including a plurality of load ports 200, and each of the plurality of load ports 200 may be connected to the host system C by the load port communicator 2y therein.

The ID reader 2x is configured to read one or more entity IDs for one or more FOUPs 4. For example, the ID reader 2x is capable of reading an entity identification (ID) 4x attached to a FOUP 4. The load port communicator 2y is configured to transmit the entity identification (ID) 4x read by the ID reader 2x, to the host system C.

The one or more sensors 2c include plural types of sensors. The plural types of sensors may be selected among a pressure sensor provided in an exhaust nozzle configured to purge gas in the FOUP 4, a mapping sensor configured to detect a wafer in the FOUP 4, a sensor configured to detect a time taken for a container door of the FOUP 4 to move from a fully-closed position to an open position, a torque sensor configured to detect a rotational torque when a latch key provided at the container door is opened and closed, and the like. In this embodiment, one or more FOUPs (or substrate storage containers) 4 may be sequentially mounted on the load port 200, and the sensors 2c may operate for an individual FOUP 4 mounted on the load port 2, for example, to detect a state of the individual FOUP 4.

In the manner described above, the load port 200 may collect data for one or more FOUPs 4. Specifically, the load port 200 may identify the one or more entities of the one or more FOUPs 4 by reading the entity IDs 4x. Further, the load port 200 may also detect one or more states of the one or more FOUPs 4 by using the sensors 2c. For example, the load port 200 may detect a pressure value of the exhaust nozzle that exhausts a gas atmosphere of each of the FOUPs 4 by using the pressure sensor. For another example, the load port 200 may detect a position of a wafer in each of the FOUPs 4 by using the mapping sensor. The methods of identifying the one or more entities of the FOUPs 4 and detecting the one or more states of the one or more FOUPs 4 may be the same as those described above with respect to the first embodiment and, hence, the detailed description of thereof is omitted. The load port communicator 2y is configured to transmit the sensor values detected by the sensors 2c, which may directly or indirectly detect the states of the FOUPs, to the host system C. This embodiment may be implemented by including a plurality of load ports 200, and each of the plurality of load ports 200 may collect data for one or more FOUPs 4 in the above-described manner.

The load port 200 is assigned a load port ID 2z. The load port ID 2z may be information for identifying the load port 200 from other load ports. A plurality of load ports 200 may be assigned load port IDs 2z, respectively. The load port communicator 2y is configured to transmit the load port ID 2z to the host system C. For example, the load port 200 may include a storage device such as a volatile memory or a non-volatile memory (e.g., a flash memory, a solid-state drive, a hard disk drive, a RAM, a ROM, etc.), the load port ID 2z may be stored in the storage device, and the load port communicator 2y may obtain the load port ID 2z from the storage device. For another embodiment, the load port communicator 2y of the load port 200 may have a network communication address (e.g., a MAC address, an IP address, etc.) to identify itself from other load port communicators, and such a network communication address may be used as the load port ID 2z. This embodiment may be implemented by including a plurality of load ports 200, and each of the plurality of load ports 200 may transmit the load port ID 2z to the host system C in the above-described manner.

The host system C includes the host system communicator Cx, the associator Cy, the database Cd, and the data processor Cz. The host system communicator Cx may receive the entity identification (ID) 4x, the one or more sensor values, and the load port ID 2z transmitted from the load port communicator 2y of the load port 200. The associator Cy may associate the sensor values with the entity identification (ID) 4x received by the host system communicator Cx. In some embodiments, the associator Cy may associate the load port ID 2z, the entity identification (ID) 4x, and the one or more sensor values with each other. The database Cd may store and accumulate the data associated by the associator Cy.

In this fourth embodiment, a plurality of load ports 200 may be implemented, and the host system C may receive data from each of the plurality of load ports 200. According to one embodiment, the host system C may separately store the data for each of the plurality of load ports 200. For example, the host system C may separately store data received from a first load port and data received from a second load port, in the database Cd. Specifically, the host system C may receive, from the first load port, the entity identification (ID) identified by the first load port, and the sensor values detected by the first load port, with the load port ID of the first load port. The data received from the first load port may be associated and stored in the above-described manner. In the same manner, the host system C may also receive, associate, and store the data from the second load port. According to another embodiment, the host system C may integrate the data for each of the plurality of load ports 200, and store the integrated data together in the database Cd. For example, the data received from the first load port and the data received from the second load port may be integrated and stored together in the database Cd.

Figure 17:
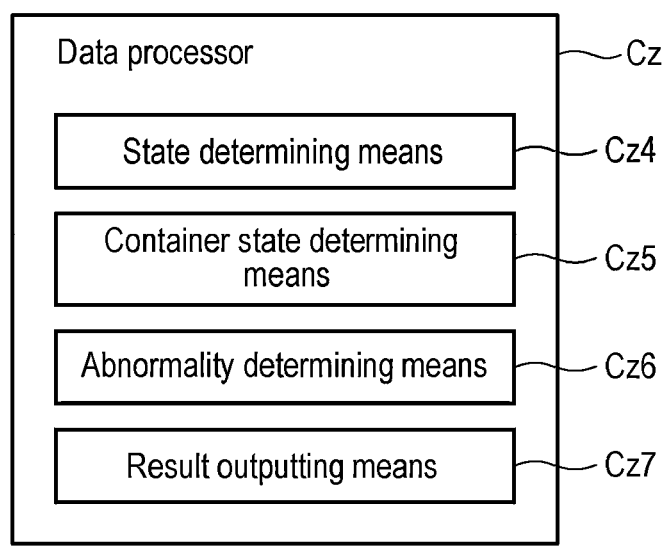
FIG. 17 is a functional block diagram of a data processor according to the fourth embodiment.

FIG. 17 is a functional block diagram of the data processor Cz of the host system C according to the fourth embodiment. The data processor Cz includes a state determining means Cz4, a container state determining means Cz5, an abnormality determining means Cz6, and a result outputting means Cz7. The state determining means Cz4 may determine (or predict) a state of each of a plurality of load ports 200 by analyzing the data in the database Cd. Specifically, the state of a specific load port 200 may indicate that occurrence or non-occurrence of an abnormality (or a deterioration) is determined based on the data received from the specific load port 200. Hereinafter, such an abnormality determined for a specific load port 200 may be referred to as an abnormality of a specific load port 200.

According to one embodiment, the state determining means Cz4 may determine a state of a specific load port 200 based on an average value of the sensor values detected by the sensors 2c of the specific load port 200. As a plurality of FOUPs 4 are sequentially mounted to each load port 200, the sensor values detected for the plurality of FOUPs 4 (including previous FOUPs to recent FOUPs) are transmitted from each load port 200 to the host system C, and stored in the database Cd of the host system C. The state determining means Cz4 may calculate a first average value of the sensor values for the specific load port 200, and may calculate a second average value of the sensor values for all the plurality of load ports 200 (or remaining load ports 200 except for the specific load port 200, among the plurality of load ports 200). The state determining means Cz4 may determine the state of the specific load port 200 by comparing the first average value with the second average value. For example, if a difference between the first average value and the second average value is greater than a predetermined value, the state determining means Cz4 may determine the abnormality of the specific load port 200.

According to another embodiment, the state determining means Cz4 may determine a state of a specific load port 200 by using a machine-learning technology. In this embodiment, a machine-learning-based model such as a neural network model, which has been trained by sensor values detected for a plurality of load ports (or an average value of the sensor values) as input data and states of the plurality of load ports 200 as output data, is provided. For example, the neural network model may be a convolution neural network model, or the like, but not limited thereto. Here, the states may indicate occurrence or non-occurrence of abnormalities of the plurality of load ports. Such a machine-learning-based model may be trained by the data processor Cz. The input data and the output data may be obtained from the database Cd. The state determining means Cz4 may input the sensor values detected for a specific load port 200 (or an average value of the sensor values) into the machine-learning-based model, and obtain a state of the specific load port 200 from the machine-learning-based model. In this manner, the state determining means Cz4 may determine the abnormality of the specific load port 200.

According to still another embodiment, the state determining means Cz4 may determine a state of a specific load port 200 by using a predetermined threshold value. In this embodiment, the state determining means Cz4 calculates a first average value of the sensor values for the specific load port 200 in the same manner as described with respect to the above embodiment. The state determining means Cz4 may determine the state of the specific load port 200 by comparing the first average value with the predetermined threshold value. For example, if the first average value is greater (or smaller) than the predetermined threshold value, the state determining means Cz4 may determine the abnormality of the specific load port 200.

The container state determining means Cz5 may analyze the data in the database Cd, and may determine (or predict) a state of each of one or more FOUPs 4. Specifically, once an abnormality of a specific load port 200 is determined, the container state determining means Cz5 may search the database Cd for one or more FOUPs 4 (for example, entity IDs or FOUP IDs of FOUPs 4), which have been mounted on the specific load port 200. For example, when searching for the one or more FOUPs 4, the container state determining means Cz5 may search for FOUPs 4 that have been mounted on the specific load port 200 for a predetermined period of time (e.g., 48 hours) before the abnormality of the specific load port 200 is determined. For another example, when searching for the one or more FOUPs 4, the container state determining means Cz5 may search for FOUPs 4 that have been mounted on the specific load port 200 for a predetermined number of times of FOUP mounting (e.g., 100 times of FOUP mounting) before the abnormality of the specific load port 200 is determined.

Subsequently, the container state determining means Cz5 determines a state of each of the one or more FOUPs 4. Here, a state of a FOUP 4 may indicate that occurrence or non-occurrence of an abnormality (or a deterioration) is determined based on the data associated with the FOUP 4. Hereinafter, such an abnormality determined for a specific FOUP 4 may be referred to as an abnormality of a specific FOUP 4.

The method for determining an abnormality of a FOUP 4, which is described above with respect to FIG. 12, may be used as a method of determining the state of each of the one or more FOUPs 4 in this fourth embodiment. According to one embodiment, the container state determining means Cz5 may determine a state of a specific FOUP 4 based on an average value of the sensor values for the specific FOUP 4. The sensor values for the specific FOUP 4 may be sensor values that have been detected as the specific FOUP is mounted on a plurality of load ports 200. In this embodiment, the container state determining means Cz5 may calculate a first average value of the sensor values for the specific FOUP 4, and may calculate a second average value of the sensor values for all the one or more FOUP 4 (or remaining FOUPs 4 except for the specific FOUP 4, among the one or more FOUPs 4). The container state determining means Cz5 may determine the state of the specific FOUP 4 by comparing the first average value with the second average value.

According to another embodiment, the container state determining means Cz5 may determine a state of a specific FOUP 4 by using a machine-learning technology. In this embodiment, a machine-learning-based model such as a neural network model, which has been trained by sensor values detected for a plurality of FOUPs (or an average value of the sensor values) as input data and states of the plurality of FOUPs as output data, is provided. For example, the neural network model may be a convolution neural network model, or the like, but not limited thereto. Here, the states may indicate occurrence or non-occurrence of abnormalities of the plurality of FOUPs. Such a machine-learning-based model may be trained by the data processor Cz. The input data and the output data may be obtained from the database Cd. The container state determining means Cz5 may input the sensor values for a specific FOUP 4 (or an average value of the sensor values) into the machine-learning-based model, and obtain a state of the specific FOUP 4 from the machine-learning-based model.

According to still another embodiment, the container state determining means Cz5 may determine a state of a specific FOUP 4 by using a predetermined threshold value. In this embodiment, the container state determining means Cz5 may calculate a first average value of the sensor values for the specific FOUP 4 in the same manner as described with respect to the above embodiment. The container state determining means Cz5 may determine the state of the specific FOUP 4 by comparing the first average value with the predetermined threshold value.

The abnormality determining means Cz6 determines whether a specific FOUP 4 among the one or more FOUPs 4 has caused the abnormality of the specific load port 200, which has been determined by the state determining means Cz4. If a state of a specific FOUP 4 among the one or more FOUPs 4 indicates occurrence of an abnormality, the abnormality determining means Cz6 may determine that the specific FOUP 4 has caused the abnormality of the specific load port 200. If a state of another specific FOUP 4 among the one or more FOUPs 4 indicates occurrence of an abnormality, the abnormality determining means Cz6 may also determine that another specific FOUP 4 has caused the abnormality of the specific load port 200, too.

The abnormality determining means Cz6 may also determine whether the specific load port 200 has caused the abnormality of the specific load port 200, which has been determined by the state determining means Cz4. In one embodiment, if all the states of the one or more FOUPs 4 indicate non-occurrence of an abnormality, the abnormality determining means Cz6 may determine that the specific load port 200 (i.e., rather than the FOUPs 4) has caused the abnormality of the specific load port 200. In another embodiment, if a rate of the number of the FOUPs whose states indicate non-occurrence of abnormality to the number of the one or more FOUPs is greater than a predetermined rate (e.g., 70%), the abnormality determining means Cz6 may determine that the specific load port 200 has caused the abnormality of the specific load port 200. In still another embodiment, if the number of the FOUPs whose states indicate non-occurrence of abnormality is greater than the number of the FOUPs whose states indicate occurrence of abnormality (for example, by a predetermined number), the abnormality determining means Cz6 may determine that the specific load port 200 has caused the abnormality of the specific load port 200. The result outputting means Cz7 outputs the cause of the abnormality of the specific load port 200 based on the determination of the abnormality determining means Cz6.

Figure 18:
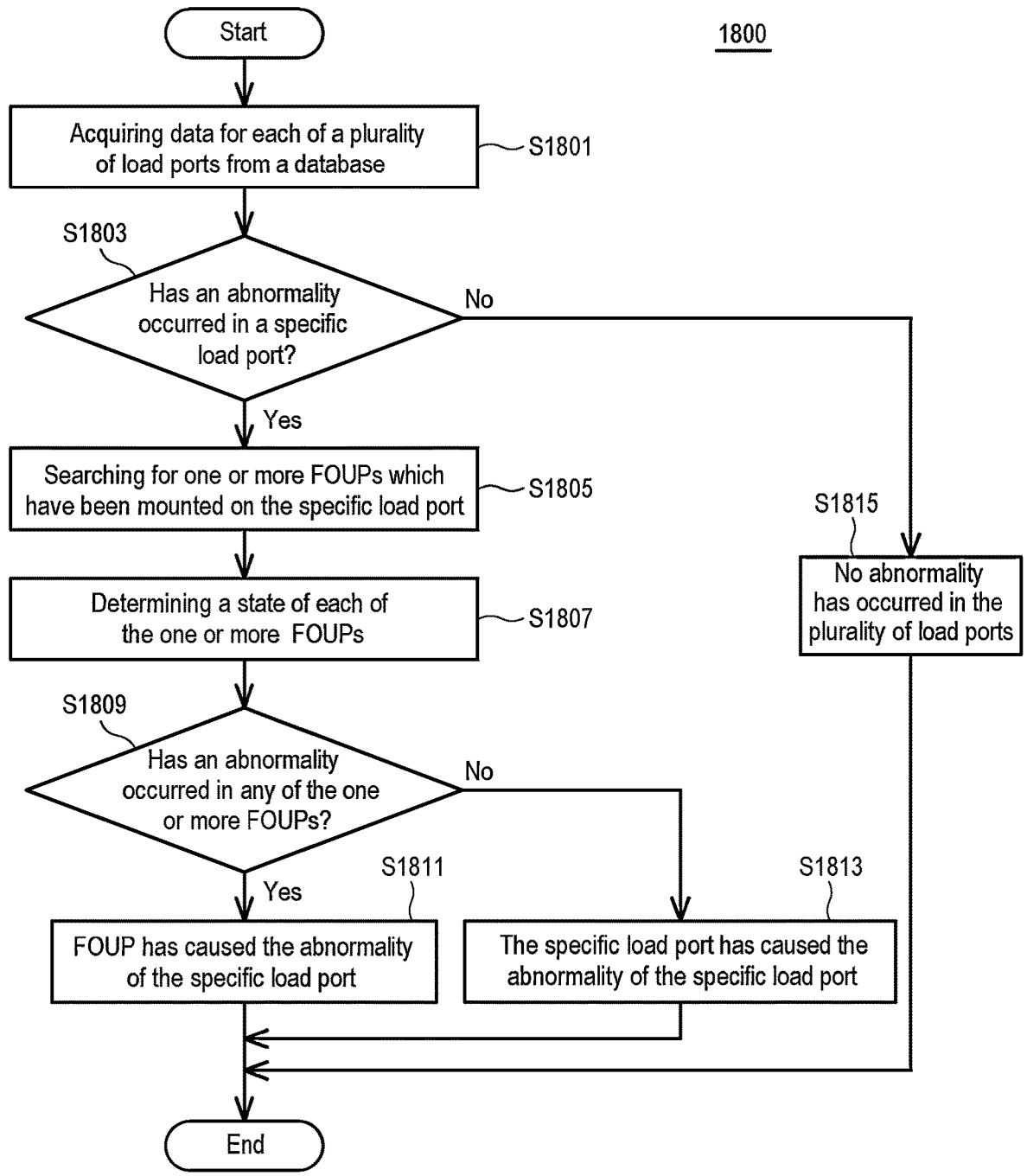
FIG. 18 is a flowchart of the data processor according to the fourth embodiment.

FIG. 18 is a flowchart 1800 that is performed by the data processor Cz according to the fourth embodiment. At S1801, the data processor Cz acquires data for each of a plurality of load ports 200 from the database Cd. The data for a load port 200 may include a load port ID 2z, one or more entity IDs (FOUP IDs) 4x, and one or more sensor values, which have been transmitted from the load port 200.

At S1803, based on the acquired data, the data processor Cz determines whether an abnormality of a specific load port 200 has occurred. If it is determined that an abnormality has occurred in none of the plurality of load ports 200 (i.e., "No" at S1803), the data processor Cz determines that no abnormality (or deterioration) has occurred at S1815, and the operation of the data processor Cz proceeds to the "End" step. By contrast, if it is determined that an abnormality has occurred in a specific load port 200 (i.e., "Yes" at S1803), the data processor Cz may search for one or more FOUPs 4, which have been mounted on the specific load port 200, at S1805.

The data processor Cz determines a state of each of the one or more FOUPs 4, at S1807, and then determines whether an abnormality (or deterioration) has occurred in any of the one or more FOUPs 4, at S1809. If it is determined that an abnormality has occurred in any of the one or more FOUPs 4 (i.e., "Yes" at S1809), the data processor Cz determines that a specific FOUP 4 whose state indicates occurrence of an abnormality has caused the abnormality of the specific load port 200, at S1811. If it is determined that an abnormality has occurred in none of the one or more FOUPs 4 (i.e., "No" at S1809), the data processor Cz determines that the specific load port 200 has caused the abnormality of the specific load port 200, at S1813. The operation of the data processor Cz then proceeds to the "End" step.

FIG. 19 depicts an example in which a specific load port 200 is determined to have caused an abnormality of the specific load port 200. The tables in FIG. 19 show a plurality of FOUPs 4 (e.g., FOUP-1, FOUP-2, FOUP-3, etc.) that have been mounted on respective load ports 200 (i.e., first to fourth load ports), and a plurality of sensor values detected for the plurality of FOUPs 4. For example, the table for the first load port shows that FOUP-1 to FOUP-3 have been sequentially mounted to the first load port, and the sensor values for FOUP-1 to FOUP-3 are 20, 20, and 20, respectively. Although each table includes three FOUPs, the number of FOUPs that have been mounted on each load port is not limited to three, but may be a large number, for example, as large as statistically meaningful.

The operation at S1803 of FIG. 18 is described with reference to this example. According to one embodiment, the state determining means Cz4 may determine a state of the first load port based on an average value of the sensor values for the first load port. In this example, the state determining means Cz4 determines a first average value of the sensor values of FOUP-1 to FOUP-3 for the first load port to be 20. Further, the state determining means Cz4 determines a second average value of all the sensor values for the first to the fourth load ports to be 12.5. In this example, the predetermined value is assumed to be 4. Here, the difference between the first average value and the second average value is greater than the predetermined value, and thus, the state determining means Cz4 determines the abnormality of the first load port.

Next, the operation at S1809 of FIG. 18 is also described with reference to this example. According to one embodiment, the container state determining means Cz5 may determine a state of a specific FOUP 4 based on an average value of the sensor values for the specific FOUP 4. In this example, the container state determining means Cz5 searches the database Cd for the FOUPs 4 (i.e., FOUP-1, FOUP-2, and FOUP-3), which have been mounted on the first load port. Further, the container state determining means Cz5 determines a state of each of FOUP-1, FOUP-2, and FOUP-3. Here, the sensor values for FOUP-1 are 20, 10, and 9 (see the tables for the first load port, the second load port, and the fourth load port). Thus, the container state determining means Cz5 determines a first average value of the sensor values for FOUP-1 to be 13. Further, the container state determining means Cz5 determines a second average value of all the sensor values for all the plurality of FOUPs 4 (i.e., FOUP-1, FOUP-2, FOUP-3, FOUP-4, and FOUP-5), which have been mounted on the first load port to the fourth load port, to be 12.5. In this example, the predetermined value is assumed to be 4. The difference between the first average value and the second average value is not greater than the predetermined value, and thus, the container state determining means Cz5 determines that no abnormality has occurred in FOUP-1. In the same manner, the container state determining means Cz5 determines that no abnormality has occurred in FOUP-2 and FOUP-3, too. As a result, the abnormality determining means Cz6 determines that the first load port has caused the abnormality of the first load port. Therefore, maintenance of the first load port may be recommended.

FIG. 20 depicts an example in which a specific FOUP 4 is determined to have caused an abnormality of the specific load port 200. The tables in FIG. 20 also show a plurality of FOUPs 4 (e.g., FOUP-1, FOUP-2, FOUP-3, etc.) that have been mounted on respective load ports 200 (i.e., first to fourth load ports), and a plurality of sensor values detected for the plurality of FOUPs 4.

The operation at S1803 of FIG. 18 is described with reference to this example. According to one embodiment, the state determining means Cz4 may determine a state of the first load port by using a predetermined threshold value. In this example, the predetermined threshold value is assumed to be 14. The state determining means Cz4 determines the first average value of the sensor values of FOUP-1 to FOUP-3 for the first load port to be 15. Since the first average value is greater than the predetermined threshold value, the state determining means Cz4 determines the abnormality of the first load port.

Next, the operation at S1809 of FIG. 18 is also described with reference to this example. In this example, the container state determining means Cz5 searches the database Cd for the FOUPs 4 (i.e., FOUP-1, FOUP-2, and FOUP-3), which have been mounted on the first load port. Further, the container state determining means Cz5 determines a state of each of FOUP-1, FOUP-2, and FOUP-3. Here, the sensor values for FOUP-1 are 22, 20, and 18 (see the tables for the first load port, the second load port, and the fourth load port). Thus, the container state determining means Cz5 determines a first average value of the sensor values for FOUP-1 to be 20. Since, the first average value of the sensor values for FOUP-1 is greater than the predetermined threshold value (i.e., 14), the container state determining means Cz5 determines the abnormality of FOUP-1. As a result, the abnormality determining means Cz6 determines that FOUP-1 has caused the abnormality of the first load port.

Figure 21:
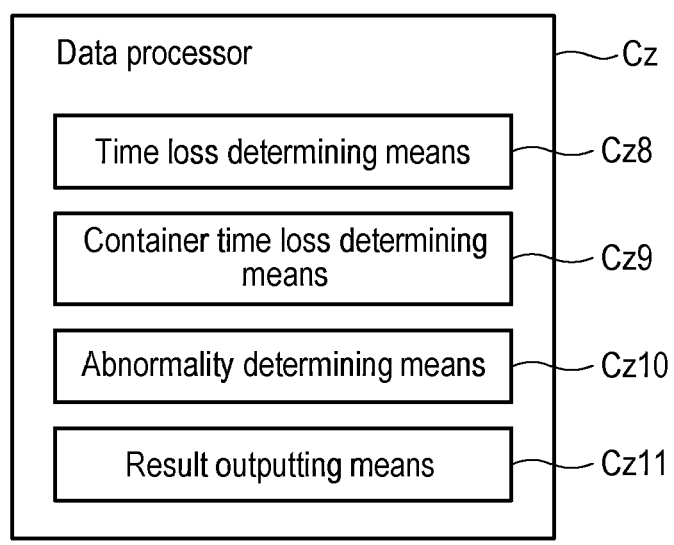
FIG. 21 is a functional block diagram of a data processor according to the fifth embodiment of the present disclosure.

In a fifth embodiment of the present disclosure, the load port 200 as illustrated in FIG. 17 may be employed. FIG. 21 illustrates a functional block diagram of a data processor Cz of a host system C used in this embodiment. Other elements and configurations of the host system C in this embodiment may be the same as or similar to those in the fourth embodiment and, hence, the detailed description thereof is omitted.

In this embodiment, the host system C receives one or more entity identifications (IDs) 4x, one or more tact times, and a load port ID 2z transmitted from a load port 200. The one or more tact times may be detected for one or more FOUPs (which have been mounted on the load port 200 and are identified by one or more entity IDs 4x) by one or more sensors 2c of the load port 200. The associator Cy of the host system C may associate the one or more tact times with the entity identifications 4x. In some embodiments, the associator Cy may associate the load port ID 2z, the one or more entity identification 4x, and the one or more tact times with each other. The database Cd may store and accumulate the data associated by the associator Cy.

The data processor Cz includes a time loss determining means Cz8, a container time loss determining means Cz9, an abnormality determining means Cz10, and a result outputting means Cz11. The time loss determining means Cz8 may determine (or predict) a state of time loss of each of a plurality of load ports 200 by analyzing the data. Specifically, the state of time loss of a specific load port 200 may indicate that occurrence or non-occurrence of a time loss is determined based on the data received from the specific load port 200. That is, the time loss determining means Cz8 determines whether a time loss has occurred in a specific load port. Hereinafter, such a time loss occurred in a specific load port 200 may be referred to as a time loss of a specific load port 200.

According to one embodiment, the time loss determining means Cz8 may determine a state of time loss of a specific load port 200 based on an average tact time of tact times detected by the sensors 2c of the specific load port 200. As a plurality of FOUPs 4 are sequentially mounted to each load port 200, the tact times detected for the plurality of FOUPs 4 (including previous FOUPs to recent FOUPs) are transmitted from each load port 200 to the host system C, and stored in the database Cd of the host system C. The time loss determining means Cz8 may calculate an average tact time of the tact times for the specific load port 200, and may calculate a standard tact time of the tact times for all the plurality of load ports 200 (or remaining load ports 200 except for the specific load port 200, among the plurality of load ports 200). The time loss determining means Cz8 may determine a state of time loss of the specific load port 200 by comparing the average tact time with the standard tact time. For example, if a difference between the average tact time and the standard tact time is greater than a predetermined value, the time loss determining means Cz8 may determine the time loss of the specific load port 200.

According to another embodiment, the time loss determining means Cz8 may determine a state of time loss of a specific load port 200 by using a machine-learning technology. In this embodiment, a machine-learning-based model such as a neural network model, which has been trained by tact times detected for a plurality of load ports (or an average tact time of the tact times) as input data and states of time loss of the plurality of load ports 200 as output data, is provided. For example, the neural network model may be a convolution neural network model, or the like, but not limited thereto. Such a machine-learning-based model may be trained by the data processor Cz. The input data and the output data may be obtained from the database Cd. The time loss determining means Cz8 may input the tact times detected for a specific load port 200 (or an average value of the tact times) into the machine-learning-based model, and obtain a state of time loss of the specific load port 200 from the machine-learning-based model. In this manner, the time loss determining means Cz8 may determine the time loss of the specific load port 200.

According to still another embodiment, the time loss determining means Cz8 may determine a state of time loss of a specific load port 200 by using a predetermined threshold value (which may also be referred to as a standard tact time). In this embodiment, the time loss determining means Cz8 calculates an average tact time of the tact times for the specific load port 200 in the same manner as described with respect to the above embodiment. The time loss determining means Cz8 may determine the state of time loss of the specific load port 200 by comparing the average tact time with the predetermined threshold value. For example, if the average tact time is greater (or smaller) than the predetermined threshold value, the time loss determining means Cz8 may determine the time loss of the specific load port 200.

The container time loss determining means Cz9 may analyze the data in the database Cd, and may determine (or predict) a state of time loss of each of one or more FOUPs 4. Specifically, once a time loss of a specific load port 200 is determined, the container time loss determining means Cz9 may search the database Cd for one or more FOUPs 4 (for example, entity IDs of FOUP IDs of FOUPs 4), which have been mounted on the specific load port 200. For example, when searching for the one or more FOUPs 4, the container time loss determining means Cz9 may search for FOUPs 4 that have been mounted on the specific load port 200 for a predetermined period of time (e.g., 48 hours) before the time loss of the specific load port 200 is determined. For another example, when searching for the one or more FOUPs 4, the container time loss determining means Cz9 may search for FOUPs 4 that have been mounted on the specific load port 200 for a predetermined number of times of FOUP mounting (e.g., 100 times of FOUP mounting) before the time loss of the specific load port 200 is determined.

Subsequently, the container time loss determining means Cz9 determines a state of time loss of each of the one or more FOUPs 4. Here, a state of time loss of a FOUP 4 may indicate that occurrence or non-occurrence of a time loss is determined based on the data associated with the FOUP 4. Hereinafter, such a time loss determined for a specific FOUP 4 may be referred to as a time loss of a specific FOUP 4.

According to one embodiment, the container time loss determining means Cz9 may determine a state of time loss a specific FOUP 4 based on an average tact time of the tact times for the specific FOUP 4. The tact times for the specific FOUP 4 may be tact times that have been detected as the specific FOUP is mounted on a plurality of load ports 200. In this embodiment, the container time loss determining means Cz9 may calculate an average tact time of the tact times for the specific FOUP 4, and may calculate a standard tact time of the tact times for all the one or more FOUP 4 (or remaining FOUPs 4 except for the specific FOUP 4, among the one or more FOUPs 4). The container tact time determining means Cz9 may determine the state of the time loss of the specific FOUP 4 by comparing the average tact time with the standard tact time.

According to another embodiment, the container time loss determining means Cz9 may determine a state of time loss of a specific FOUP 4 by using a machine-learning technology. The method of using machine learning in this embodiment is similar to the method of using machine learning described in the fourth embodiment, and, therefore, the detailed description thereof is omitted, except for that tact times are used instead of sensor values.

According to still another embodiment, the container time loss determining means Cz9 may determine a state of time loss a specific FOUP 4 by using a predetermined threshold value (which may also be referred to as a standard tact time). In this embodiment, the container time loss determining means Cz5 may calculate an average tact time of the tact times for the specific FOUP 4 in the same manner as described with respect to the above embodiment. The container time loss determining means Cz9 may determine the state of the tact time of the specific FOUP 4 by comparing the average tact time with the predetermined threshold value.

The operation of the abnormality determining means Cz10 in this embodiment is similar to that of the abnormality determining means Cz6 in the fourth embodiment. The abnormality determining means Cz10 determines whether a specific FOUP 4 among the one or more FOUPs 4 has caused the time loss of the specific load port 200, which has been determined by the time loss determining means Cz8. The abnormality determining means Cz10 may also determine whether the specific load port 200 has caused the time loss of the specific load port 200. In one embodiment, if a state of time loss of a specific FOUP 4 among the one or more FOUPs 4 indicates occurrence of a time loss, the abnormality determining means Cz10 may determine that the specific FOUP 4 has caused the time loss of the specific load port 200. If all the states of time loss of the one or more FOUPs 4 indicate non-occurrence of time loss, the abnormality determining means Cz10 may determine that the specific load port 200 has caused the time loss of the specific load port 200. Other embodiments described above with respect to the fourth embodiment may also be applied to this fifth embodiment.

Figure 22:
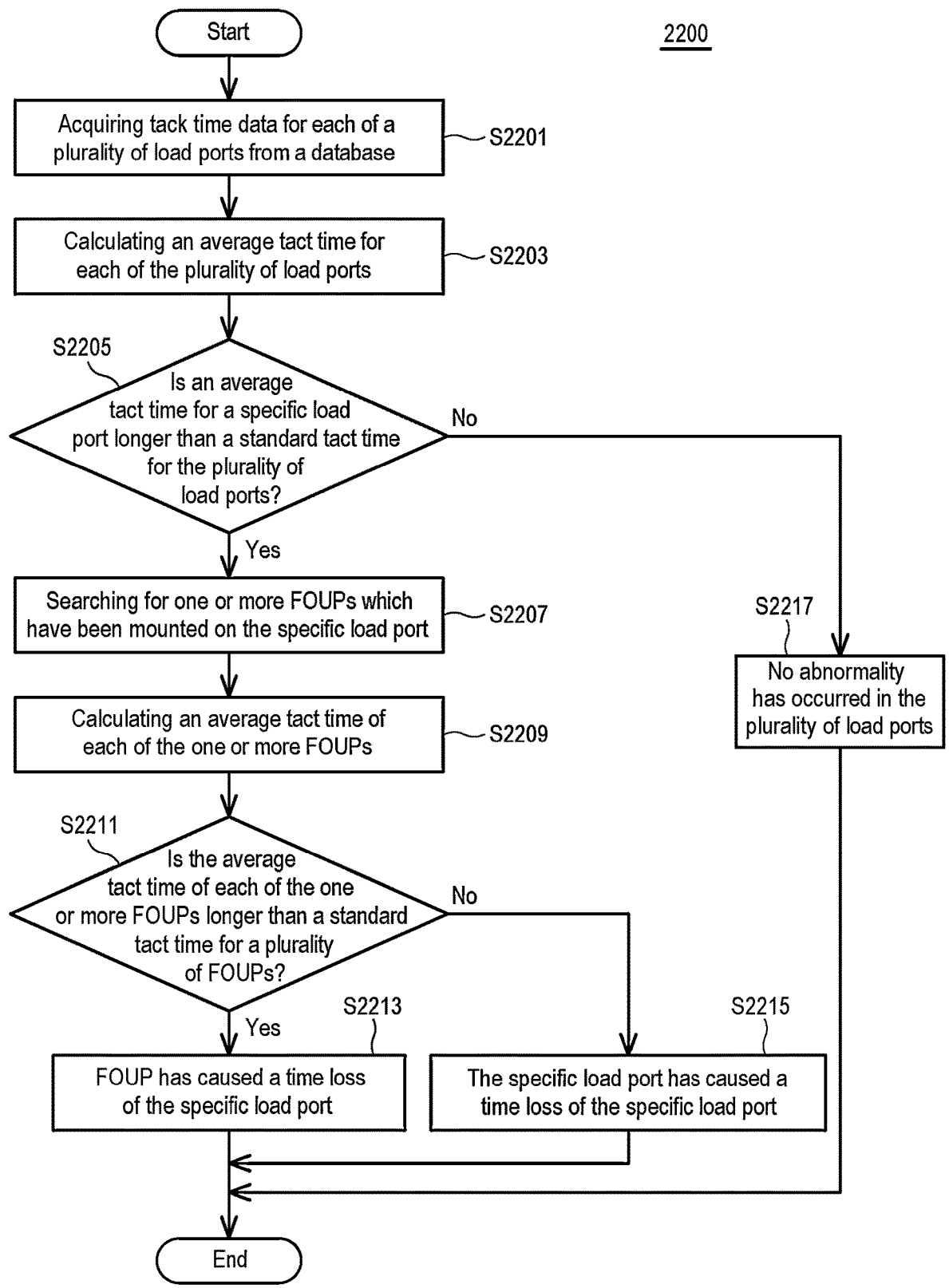
FIG. 22 is a flowchart of the data processor according to the fifth embodiment.

FIG. 22 is a flowchart 2200 that is performed by the data processor Cz according to the fifth embodiment. At S2201, the data processor Cz acquires tact time data for each of a plurality of load ports 200 from the database Cd. The, data for a load port 200 may include a load port ID 2$z$, one or more entity ID (FOUP IDs) 4$x$, and one or more tact times, which have been transmitted from the load port 200.

At S2203, based on the acquired tact time data, the data processor Cz may calculate an average tact time for each of the plurality of load ports 200. At S2205, the data processor Cz may determine whether the average tact time for a specific load port is longer than a standard tact time for the plurality of load ports 200. If it is determined that none of the average tact times for the plurality of load ports 200 are longer than the standard tact time for the plurality of load ports 200 (i.e., "No" at S2205), the data processor Cz determines that no time loss has occurred in the plurality of load ports 200 at S2217, and the operation of the data processor Cz proceeds to the "End" step. By contrast, if it is determined that the average tact time for the specific load port 200 is longer than the standard tact time for the plurality of load ports 200 (i.e., "Yes" at S2205), the data processor Cz may search for one or more FOUPs 4, which have been mounted on the specific load port 200, at S2207.

At S2209, the data processor Cz may calculate an average tact time of each of the one or more FOUPs 4. For example, the data processor Cz calculates an average tact time of a specific FOUP 4 among the one or more FOUPs 4, based on the tact times for the specific FOUP 4. At S2211, the data processor Cz determines whether the average tact time for each of the one or more FOUPs 4 is longer than the standard tact time for a plurality of FOUPs 4. If it is determined that any of the average tact times for the one or more FOUPs 4 is longer than the standard tact time for the plurality of FOUPs 4 (i.e., "YES" at S2211), the data processor Cz determines that a specific FOUP 4 whose state of time loss indicates occurrence of time loss has caused the time loss of the specific load port 200. In other words, if it is determined that a time loss has occurred in the specific FOUP 4, the data processor Cz determines that the specific FOUP 4 has caused the time loss of the specific load port 200.

If it is determined that none of the average tact times for the one or more FOUPs 4 are longer than the standard tact time for the plurality of FOUPs 4 (i.e., "NO" at S2211), the data processor Cz determines that the specific load port 200 has caused the time loss of the specific load port 200. In other words, if it is determined that a time loss has occurred in none of the one or more FOUPs 4, the data processor Cz determines that the specific load port 200 has caused the time loss of the specific load port 200. In this case, maintenance of the first load port 200 may be recommended.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of diagnosing deterioration of a load port, comprising:
   identifying a plurality of entities for a plurality of substrate storage containers by a plurality of load ports capable of transferring a substrate into and out of the plurality of substrate storage containers;
   detecting directly or indirectly a plurality of states of the plurality of substrate storage containers by a plurality of sensors provided at the plurality of load ports;
   associating the plurality of load ports, the plurality of entities identified in the act of identifying the plurality of entities, and a plurality of sensor values detected in the act of detecting the plurality of states, with each other;
   accumulating, in a database, data associated in the act of associating the plurality of load ports, the plurality of entities, and the plurality of sensor values; and
   analyzing the data in the database and determining a deterioration state of each of the plurality of load ports,
   wherein if an abnormality of a specific load port is determined in the act of determining the deterioration state of each of the plurality of load ports, the method further comprises:
      searching for one or more substrate storage containers that have been mounted on the specific load port;
      determining a state of each of the one or more substrate storage containers found in the act of searching for the one or more substrate storage containers; and
      determining a cause of the abnormality of the specific load port based on a result of the act of determining the deterioration state of each of the plurality of load ports and a result of the act of determining the state of each of the one or more substrate storage containers.

2. The method of claim 1, wherein the act of determining the cause of the abnormality of the specific load port comprises:
   upon determining that an abnormality has occurred in a specific substrate storage container in the act of determining the state of each of the one or more substrate storage containers, determining that the specific substrate storage container has caused the abnormality of the specific load port; and
   upon determining that an abnormality has occurred in none of the one or more substrate storage containers in the act of determining the state of each of the one or more substrate storage containers, determining that the specific load port has caused the abnormality of the specific load port.

3. A substrate storage container management system comprising:
   a plurality of load ports capable of transferring a substrate into and out of a plurality of substrate storage containers, each of the plurality of load ports comprising:
      an ID (identification) reader capable of reading a plurality of entity IDs attached to the plurality of substrate storage containers;
      one or more sensors configured to directly or indirectly detect a plurality of states of the plurality of substrate storage containers; and
   a host system,
   wherein the plurality of load ports are assigned a plurality of load port IDs, which identifies the plurality of load ports from each other, respectively,
   wherein each of the plurality of load ports comprises a load port communicator configured to transmit one or more sensor values detected by the one or more sensors to the host system,
   wherein the host system comprises a host system communicator configured to receive the one or more sensor values transmitted from the plurality of load ports, and
   wherein the plurality of load ports or the host system comprises:
      an associator configured to associate the plurality of load port IDs, the plurality of entity IDs read by the ID reader, and the one or more sensor values with each other;
      a database in which data associated by the associator is accumulated; and
      a data processor configured to analyze the data in the database and to determine deterioration states of the plurality of load ports for the plurality of load port IDs, respectively,
   wherein the data processor is further configured to, if an abnormality of a specific load port is determined:
      search for one or more substrate storage containers that have been mounted on the specific load port;
      determine a state of each of the one or more substrate storage containers found in the act of searching for the one or more substrate storage containers; and
      determine a cause of the abnormality of the specific load port based on a result of the act of determining the deterioration state of each of the plurality of load ports and a result of the act of determining the state of each of the one or more substrate storage containers.

4. The substrate storage container management system of claim 3, wherein the one or more sensors comprise plural types of sensors selected among a pressure sensor provided in an exhaust nozzle configured to purge gas in the plurality of substrate storage containers, a mapping sensor configured to detect a wafer in the plurality of substrate storage containers, a sensor configured to detect a time taken for a container door to move from a fully-closed position to an open position, a torque sensor configured to detect a rotational torque when a latch key provided at the container door is opened and closed,
   wherein the load port communicator is configured to transmit sensor values detected by the plural types of sensors to the host system, and
   wherein the associator is configured to associate the plurality of load port IDs, the plurality of entity IDs, and the sensor values detected by the plural types of sensors with each other.

5. A method of diagnosing a load port, comprising:
   identifying a plurality of entities for a plurality of substrate storage containers by a plurality of load ports capable of transferring a substrate into and out of the plurality of substrate storage containers;
   measuring a plurality of tact times for the plurality of substrate storage containers, which have been taken for the plurality of load ports, respectively;
   associating the plurality of load ports, the plurality of entities identified in the act of identifying the plurality of entities, and the plurality of tact times measured in the act of measuring the plurality of tact times, with each other;

accumulating, in a database, data associated in the act of associating the plurality of load ports, the plurality of entities, and the plurality of tact times; and analyzing the data in the database and determining a state of time loss of each of the plurality of load ports, wherein if a time loss of a specific load port is determined in the act of determining the state of time loss of each of the plurality of load ports, the method further comprises:

searching for one or more substrate storage containers that have been mounted on the specific load port;

determining a state of time loss of each of the one or more substrate storage containers found in the act of searching for the one or more substrate storage containers; and determining a cause of the time loss of the specific load port based on a result of the act of determining the state of time loss of each of the plurality of load ports and a result of the act of determining the state of time loss of each of the one or more substrate storage containers.

6. The method of claim 5, wherein the act of determining the cause of the time loss of the specific load port comprises:

upon determining that a time loss has occurred in a specific substrate storage container in the act of determining the state of time loss of each of the one or more substrate storage containers, determining that the specific substrate storage container has caused of the time loss of the specific load port; and upon determining that a time loss has occurred in none of the one or more substrate storage containers in the act of determining the state of time loss of each of the one or more substrate storage containers, determining that the specific load port has caused the time loss of the specific load port.

* * * * *